United States Patent
Kim et al.

(10) Patent No.: US 11,574,970 B2
(45) Date of Patent: Feb. 7, 2023

(54) DISPLAY DEVICE WITH GATE CONDUCTIVE LAYER FORMING WIRE PAD IN PAD AREA AND METHOD OF FABRICATING THE SAME

(71) Applicant: SAMSUNG DISPLAY CO., LTD., Yongin-si (KR)

(72) Inventors: Seul Ki Kim, Incheon (KR); Seung Sok Son, Goyang-si (KR); Kap Soo Yoon, Seoul (KR); Woo Geun Lee, Suwon-si (KR); Su Jung Jung, Yongin-si (KR); Seung Ha Choi, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 240 days.

(21) Appl. No.: 16/895,756

(22) Filed: Jun. 8, 2020

(65) Prior Publication Data
US 2021/0036076 A1    Feb. 4, 2021

(30) Foreign Application Priority Data
Jul. 29, 2019   (KR) .......................... 10-2019-0091444

(51) Int. Cl.
*H01L 27/32*        (2006.01)

(52) U.S. Cl.
CPC ...... *H01L 27/3258* (2013.01); *H01L 27/3246* (2013.01); *H01L 27/3248* (2013.01); *H01L 27/3276* (2013.01); *H01L 2227/323* (2013.01)

(58) Field of Classification Search
CPC ............. H01L 27/3258; H01L 27/3246; H01L 27/3248; H01L 27/3276; H01L 2227/323
See application file for complete search history.

(56) References Cited

U.S. PATENT DOCUMENTS

| | | | |
|---|---|---|---|
| 2018/0006098 A1* | 1/2018 | Hong | .................. H01L 27/3262 |
| 2018/0090695 A1 | 3/2018 | Maruyama | |
| 2018/0166472 A1 | 6/2018 | Liang et al. | |
| 2018/0173349 A1 | 6/2018 | Cho et al. | |

FOREIGN PATENT DOCUMENTS

| | | |
|---|---|---|
| KR | 10-1177580 | 8/2012 |
| KR | 10-2016-0033296 | 3/2016 |
| KR | 10-1801974 | 11/2017 |
| KR | 10-1815256 | 1/2018 |
| KR | 10-1881895 | 7/2018 |

* cited by examiner

*Primary Examiner* — Lex H Malsawma
(74) *Attorney, Agent, or Firm* — F. Chau & Associates, LLC

(57) ABSTRACT

A display device includes a substrate having a display area and a pad area. A gate conductive layer disposed on the substrate includes a gate conductive metal layer and a gate capping layer. The gate conductive layer forms a gate electrode in the display area and a wire pad in the pad area that is exposed by a pad opening. An interlayer insulating film disposed on the gate conductive layer covers the gate electrode. A data conductive layer disposed on the interlayer insulating film in the display area includes source and drain electrodes. A passivation layer disposed on the data conductive layer covers the source and drain electrodes. A via layer is disposed on the passivation layer. A pixel electrode is disposed on the via layer. The pixel electrode is connected to the source electrode through a contact hole penetrating the via layer and the passivation layer.

21 Claims, 21 Drawing Sheets

DISPLAY DEVICE WITH GATE CONDUCTIVE LAYER FORMING WIRE PAD IN PAD AREA AND METHOD OF FABRICATING THE SAME

CROSS-REFERENCE TO RELATED APPLICATION

This application claims priority under 35 U.S.C. § 119 to Korean Patent Application No. 10-2019-0091444, filed on Jul. 29, 2019 in the Korean Intellectual Property Office, the disclosure of which is incorporated by reference in its entirety herein.

TECHNICAL FIELD

The present disclosure relates to a display device and a method of fabricating the same.

DISCUSSION OF RELATED ART

Numerous electronic devices include a display device for displaying an image to a viewer, such as televisions (TVs), smartphones, tablet personal computers (PCs), digital cameras, notebook computers, navigation devices, etc. The display device may include a plurality of pixels and a plurality of pixel circuits for driving the pixels. The pixel circuits include wires and thin-film transistors (TFTs) which are formed on an insulating substrate. The pixel circuits may also include wire pads provided at the ends of the wires. External devices can be mounted on the wire pads.

The display device may be formed by multiple mask processes. The mask processes may be useful for patterning wires or insulating films. However, the process efficiency of the manufacturing process may decrease as the number of mask processes increases. Additionally, reactive chemicals that are used in the mask processes, may cause corrosion of the conductive layers that it contacts. Therefore, the reliability of the display device may deteriorate due to the corrosion of wire pads that are exposed to the reactive chemicals.

SUMMARY

Exemplary embodiments of the present inventive concepts provide a display device including wire pads with high reliability.

Exemplary embodiments of the present inventive concepts also provide a method of fabricating a display device that improves process efficiency.

However, exemplary embodiments of the present inventive concepts are not restricted to those set forth herein. The above and other embodiments of the present inventive concepts will become more apparent to one of ordinary skill in the art to which the present disclosure pertains by referencing the detailed description of exemplary embodiments of the present inventive concepts provided below.

According to an exemplary embodiment of the present inventive concepts, a display device includes a substrate having a display area and a pad area. A gate conductive layer is disposed on the substrate. The gate conductive layer includes a gate conductive metal layer and a gate capping layer that is disposed on the gate conductive metal layer. The gate conductive layer forms a gate electrode disposed in the display area and a wire pad disposed in the pad area. An interlayer insulating film is disposed on the gate conductive layer and covers the gate electrode. The wire pad is exposed by a pad opening. A data conductive layer is disposed on the interlayer insulating film in the display area. The data conductive layer includes source and drain electrodes. A passivation layer is disposed on the data conductive layer and covers the source and chain electrodes. A via layer is disposed on the passivation layer. A pixel electrode is disposed on the via layer. The pixel electrode is connected to the source electrode through a contact hole that penetrates the via layer and the passivation layer.

In an exemplary embodiment, the pad opening is formed by the interlayer insulating film and the via layer, and the interlayer insulating film and the via layer, which form a inner sidewalls of the pad opening are aligned with each other In an exemplary embodiment, the passivation layer is not disposed in the pad area.

In an exemplary embodiment, in the pad area, the via layer is disposed directly on the interlayer insulating film.

In an exemplary embodiment, the via layer includes a first region overlapping with the pixel electrode in the display area and a second region not overlapping with the pixel electrode in the display area and having a smaller height than a height of the first region. The via layer further includes a third region which is disposed in the pad area, and the third region has a smaller height than the second region.

In an exemplary embodiment, the interlayer insulating film includes a first portion disposed in the display area and a second portion disposed in the pad area and having a smaller thickness than the first portion, and the second portion overlaps with the third region of the via layer.

In an exemplary embodiment, the pad opening is formed by the interlayer insulating film and the passivation layer, and the interlayer insulating film and the passivation layer, which form a inner sidewalls of the pad opening are aligned with each other In an exemplary embodiment, the via layer is not disposed in the pad area.

In an exemplary embodiment, the passivation layer includes a third portion which is disposed in the display area and a fourth portion which is disposed in the pad area and has a smaller thickness than the third portion.

In an exemplary embodiment, the display device further includes a pixel-defining film disposed on the pixel electrode, wherein the pixel-defining film fills the second region of the via layer.

In an exemplary embodiment, the gate capping layer includes a zinc indium oxide (ZIO) film, an indium zinc oxide (IZO) film, an indium tin oxide (ITO) film, or a titanium (Ti)/molybdenum (Mo)/indium tin oxide (ITO) film.

In an exemplary embodiment, the gate conductive metal layer includes a gate main metal layer which is in contact with the gate capping layer from below the gate capping layer and includes copper (Cu).

According to an exemplary embodiment of the present inventive concepts, a method of fabricating a display device includes forming a substrate including a display area and a pad area. A gate conductive layer is formed on the substrate, the gate conductive layer includes a gate conductive metal layer and a gate capping layer deposited on the gate conductive metal layer. The gate conductive layer forms a gate electrode disposed in the display area and a wire pad disposed in the pad area. An interlayer insulating film is formed on the gate conductive layer. A data conductive layer is formed on the interlayer insulating film. The data conductive layer includes source and drain electrodes that are disposed in the display area. A passivation layer is formed on the data conductive layer. A via layer is formed on the passivation layer. The via layer includes a first opening that overlaps with the source electrode in the display area and a second opening that overlaps with the wire pad in the pad area. A first material layer is formed for forming a pixel electrode on the via layer. A first mask pattern is formed on the first material layer. The first material layer is etched using the first mask pattern. The wire pad is exposed by etching the interlayer insulating film, which overlaps with the wire pad, with a remaining portion of the first mask pattern.

In an exemplary embodiment, the etching the interlayer insulating film with the first mask pattern remained, comprises performing an "entire-surface" etching process.

In an exemplary embodiment, as a result of the "entire-surface" etching process, part of the via layer not covered by the first mask pattern is etched so that the via layer is divided into a first region overlapping with the pixel electrode and a second region not overlapping with the pixel electrode and having a smaller height than the first region.

In an exemplary embodiment, the forming the passivation layer, comprises forming a second material layer for forming the passivation layer on the data conductive layer, and forming a second mask pattern on the second material layer to expose the pad area and part of the second material layer that overlaps with the source electrode, and etching the passivation layer using the second mask pattern.

In an exemplary embodiment, during the etching of the passivation layer, part of the interlayer insulating film in the pad area is etched so that the interlayer insulating film is divided into a first portion disposed in the display area and a second portion disposed in the pad area and having a smaller thickness than the first portion.

In an exemplary embodiment, the method further includes forming the via layer on part of the passivation layer that is not etched, and removing part of the passivation layer, exposed by the second opening of the via layer, by performing an "entire-surface" etching process.

In an exemplary embodiment, the gate capping layer includes a zinc indium oxide (ZIO) film, an indium zinc oxide (IZO) film, an indium tin oxide (ITO) film, or a titanium (Ti)/molybdenum (MO)/indium tin oxide (ITO) film.

In an exemplary embodiment, the gate conductive metal layer includes a gate main metal layer which is in contact with the gate capping layer from below the gate capping layer and includes copper (Cu).

According to an exemplary embodiment of the present inventive concepts, a display device includes a substrate having a display area and a pad area. A gate conductive layer is disposed on the substrate. The gate conductive layer includes a gate conductive metal layer and a gate capping layer that is disposed above the gate conductive metal layer. The gate conductive layer forms a gate electrode disposed in the display area and a wire pad disposed in the pad area. An interlayer insulating film is disposed on the gate conductive layer and covers the gate electrode. The gate capping layer of the wire pad is exposed by a pad opening and the gate capping layer is configured to be a contact electrode for the wire pad.

According to the aforementioned and other embodiments of the present disclosure, a conductive layer that forms wire pads can be prevented from being in direct contact with a reactive material, and thus, reliability can be improved.

In addition, a gate capping layer can be used as the contact electrodes of wire pads. Thus, since no additional mask process is needed for forming the contact electrodes of the wire pads, process efficiency can be improved.

Other features and embodiments may be apparent from the following detailed description, the drawings, and the claims.

BRIEF DESCRIPTION OF THE DRAWINGS

The above and other embodiments and features of the present inventive concepts will become more apparent by describing in detail exemplary embodiments thereof with reference to the attached drawings, in which.

DETAILED DESCRIPTION OF THE EXEMPLARY EMBODIMENTS

The present invention will now be described more fully hereinafter with reference to the accompanying drawings, in which exemplary embodiments of the present inventive concepts are shown. The present inventive concepts may, however, be embodied in different forms and should not be construed as limited to the exemplary embodiments set forth herein.

It will also be understood that when a layer is referred to as being "on" another layer or substrate, it can be directly on the other layer or substrate, or one or more intervening layers may also be present. The same reference numbers indicate the same components throughout the specification It will be understood that, although the terms "first," "second," etc. may be used herein to describe various elements, these elements should not be limited by these terms. These terms may only be used to distinguish one element from another element. For instance, a first element discussed below could be termed a second element without departing from the teachings of the present inventive concepts. Similarly, the second element could also be termed the first element.

Exemplary embodiments of the present inventive concepts will hereinafter be described with reference to the accompanying drawings.

Figure 1:
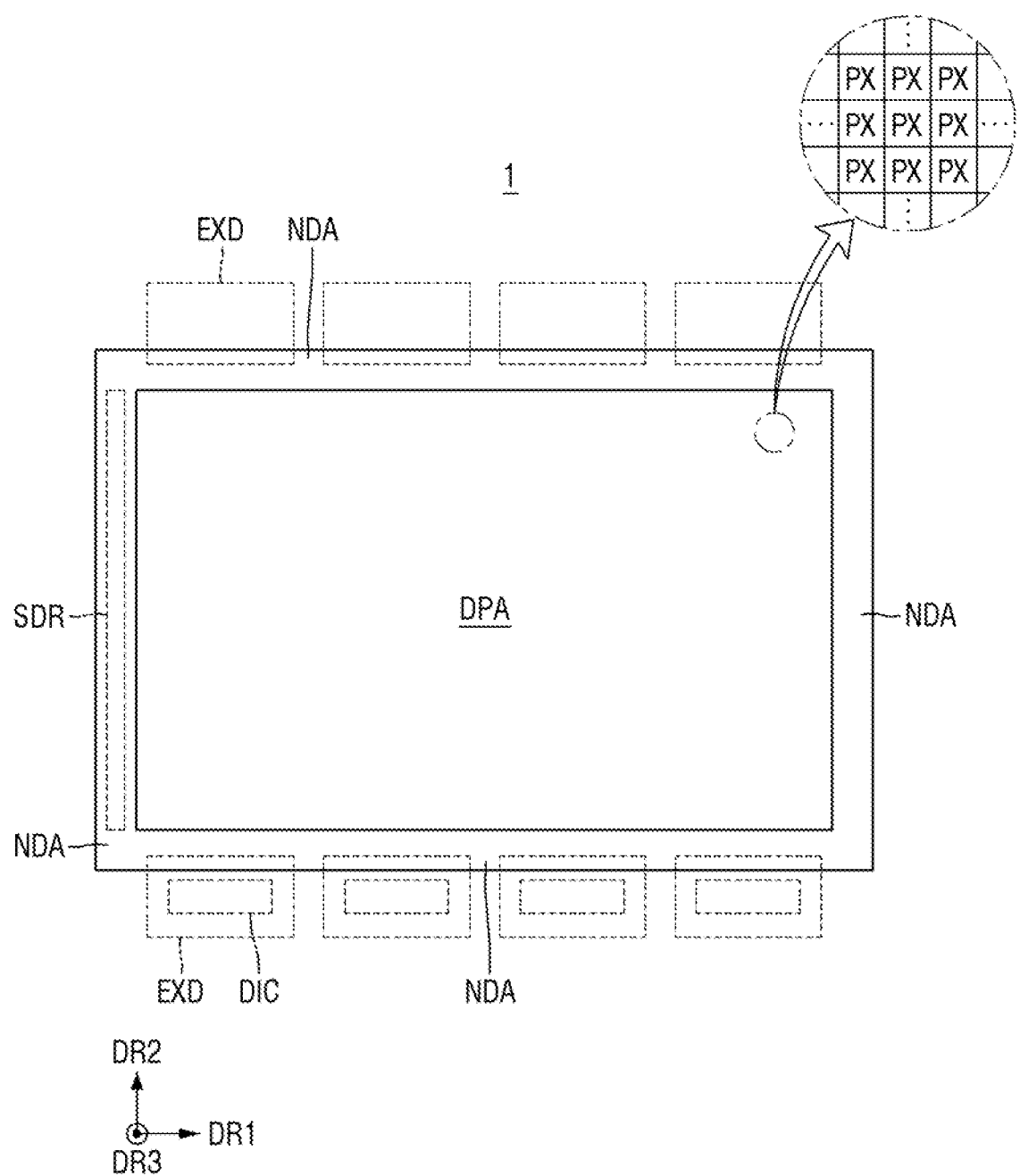
FIG. 1 is a top plan view of a display device according to an exemplary embodiment of the present inventive concepts.

FIG. 1 is a top plan view of a display device according to an exemplary embodiment of the present inventive concepts.

Referring to FIG. 1, a display device 1 may be any type of electronic devices that provide a display screen. For example, in the exemplary embodiment shown in FIG. 1, the display device 1 is illustrated as being a TV. However, exemplary embodiments of the present inventive concepts are not limited thereto. For example, in other exemplary embodiments, the display device 1 may be a notebook computer, a monitor, a billboard, a mobile phone, a smartphone, a tablet personal computer (PC), an electronic watch, a smart watch, a watchphone, a mobile communication terminal, an electronic notepad, an electronic book reader, a portable multimedia player (PMP), a navigation device, a gaming console, a digital camera, an Internet-of-Things (IoT) device, etc. In an exemplary embodiment, the display device 1 may have a high or ultra-high definition of 4K, 8K, or the like.

The display device 1 may be classified in various manners according to the image-generating elements of the device. For example, the display device 1 may be an organic light-emitting diode (OLED) display device, an inorganic electroluminescent (EL) display device, a quantum-dot light-emitting diode (QED) display device, a micro-light-emitting diode (micro-LED) display device, a plasma display panel (PDP) display device, a field emission display (FED) device, a cathode ray tube (CRT) display device, a liquid crystal display (LCD) device, or an electrophoretic display (EPD) device. However, exemplary embodiments of the present inventive concepts are not limited thereto. For convenience of explanation, the display device 1 will hereinafter be described as an OLED display device. However, the display device 1 may also be applicable to various display devices other than an OLED display device without departing from the scope of the present inventive concepts.

As shown in the exemplary embodiment of FIG. 1, the display device 1 may have a rectangular shape in a plan view (e.g., when viewed from the third direction DR3). However, in other exemplary embodiments, the display device 1 may have various other shapes, such as other polygonal shapes, a spherical shape, etc. In an exemplary embodiment in which the display device 1 is a TV, the display device 1 may be arranged so that the relatively longer sides are aligned in a horizontal direction (e.g., extending in the first direction DR1) and the relatively shorter sides are aligned in a vertical direction (e.g., extending in the second direction DR2). However, exemplary embodiments of the present inventive concepts are not limited thereto. For example, the display device 1 may be arranged so that its relatively longer sides are aligned in a vertical direction (e.g., extending in the second direction DR2) and its relatively shorter sides are aligned in a horizontal direction (e.g., extending in the first direction DR1). Alternatively, the display device 1 may be rotatably installed so that its relatively longer sides may be variably aligned either in the horizontal direction or in the vertical direction.

The display device 1 may include a display area DPA and a non-display area NDA. The display area DPA may be an active region in which an image is displayed. The display area DPA, like the display device 1, may have a rectangular shape in a plan view.

The display area DPA may include a plurality of pixels PX. The pixels PX may be arranged in row and column directions. The pixels PX may have a rectangular or square shape in a plan view (e.g., when viewed from the third direction DR3). However, exemplary embodiments of the present inventive concepts are not limited thereto. For example, in another exemplary embodiment, the pixels PX may have a rhombus shape in a plan view (e.g., in the third direction DR3) so that the sides of each of the pixels PX are inclined (e.g., extending obliquely) with respect to the sides of the display device 1. The pixels PX may include multiple groups of pixels PX that display different colors. For example, in an exemplary embodiment, the pixels PX may include first color pixels PX which are red pixels, second color pixels PX which are green pixels, and third color pixels PX which are blue pixels. However, exemplary embodiments of the present inventive concepts are not limited thereto. In an exemplary embodiment, the pixels PX may be alternately arranged in a stripe or PenTile fashion.

The non-display area NDA may be disposed on the periphery of the display area DPA. The non-display area NDA may surround the entire display area DPA or part of the display area DPA (e.g., in the first direction DR1 and/or the second direction DR2). The display area DPA may have a rectangular shape, and the non-display area NDA may be disposed adjacent to all four sides of the display area DPA (e.g., in the first direction DR1 and/or second direction DR2). The non-display area NDA may form the bezel of the display device 1.

Driving circuits or driving elements for driving the display area DPA may be disposed in the non-display area NDA. For example, in first and second non-display areas NDA adjacent to first and second relatively longer sides (e.g., the portions of the non-display areas on the lower and upper sides of the display device 1 in the second direction DR2), respectively, of the display device 1, a pad unit may be provided on a display substrate of the display device 1. External devices EXD may be mounted on pad electrodes of the pad unit. Examples of the external devices EXD may include a connecting film, a printed circuit board (PCB), a driving integrated chip (DIC), a connector, a wire connecting film, etc. However, examples of the external devices EXD are not limited thereto. In an exemplary embodiment, in a third non-display area NDA adjacent to a first relatively shorter side (e.g., the portion of the non-display area on the left side of the display device 1 in the first direction DR1) of the display device 1, a scan driving unit SDR may be formed directly on the display substrate of the display device 1.

Figure 2:
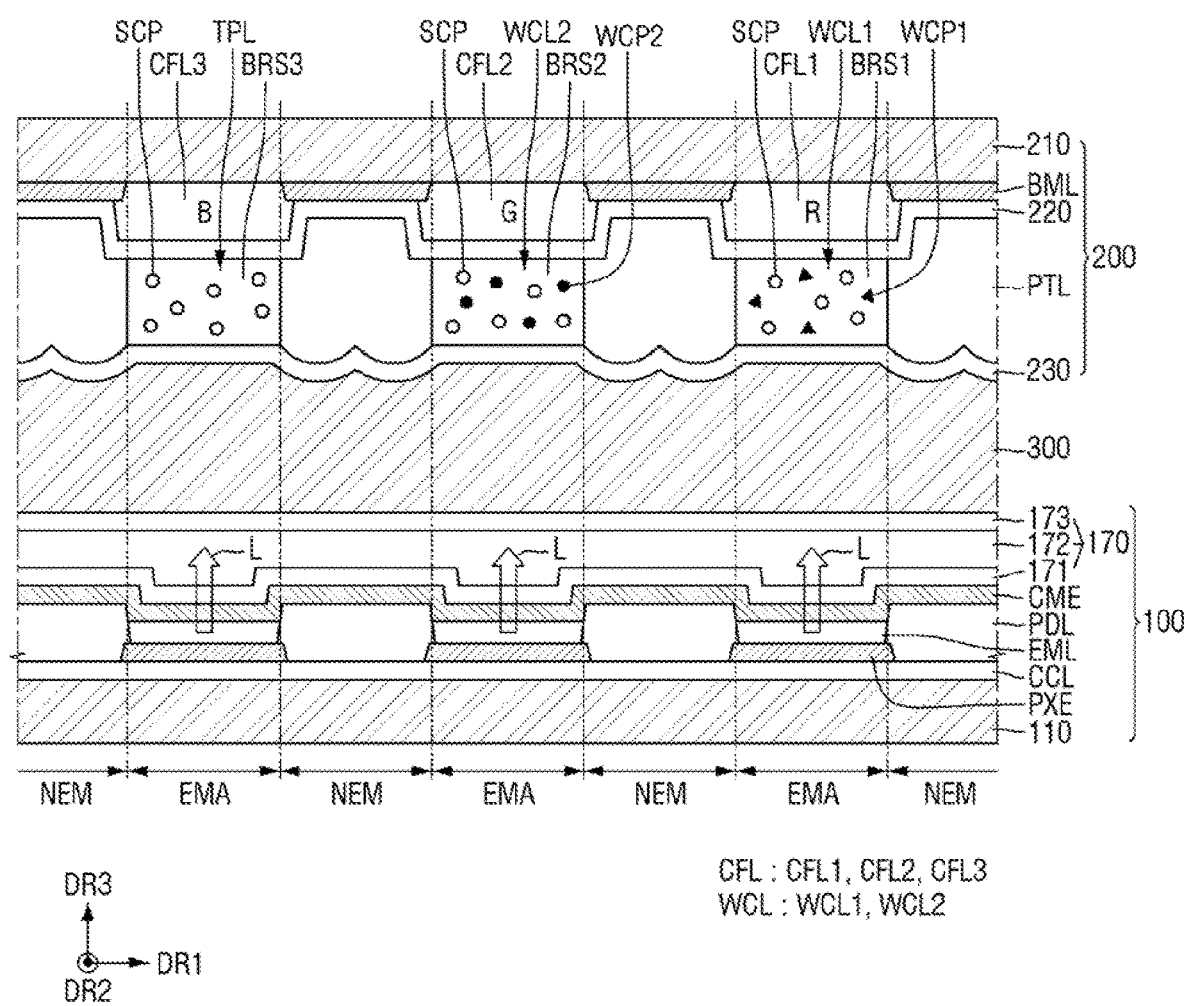
FIG. 2 is a cross-sectional view of the display device of FIG. 1 according to an exemplary embodiment of the present inventive concepts.

FIG. 2 is a cross-sectional view of the display device of FIG. 1.

The exemplary embodiment shown in FIG. 2 includes a top emission-tape display device which emits light L in a direction away from a first substrate 110 (e.g., in the third direction DR3) where emission layers EML are formed (e.g., in a direction toward a second substrate 210). However, exemplary embodiments of the present inventive concepts are not limited thereto. For example, in other exemplary embodiments, the display device 1 may be a bottom emission-type display device or a dual emission-type display device.

Referring to FIG. 2, the display device 1 may include the emission layers EML, an encapsulation structure 170 which covers the emission layers EML, and a color control structure that is disposed on the encapsulation structure 170. In an exemplary embodiment, the color control structure may include wavelength conversion layers WCL, a light-transmitting layer(s) TPL and color filter layers CFL. The display device 1 may further include a first display substrate 100 and a second display substrate 200 which is opposite to the first display substrate 100. For example, the first display substrate 100 and second display substrate 200 may be spaced apart in the third direction DR3 with the filling layer 300 disposed therebetween. The emission layers EML, the encapsulation structure 170, and the color control structure (e.g., the wavelength conversion layers WCL, the light-transmitting layer TPL, and the color filter layers CFL) may be included in one of the first and second display substrates 100 and 200.

For example, in an exemplary embodiment, the first display substrate 100 may include the first substrate 110, the emission layers EML which are disposed on a first surface of the first substrate 110 (e.g., a top surface of the first substrate in the third direction DR3), and the encapsulation structure 170 which is disposed on the emission layers EML (e.g., in the third direction DR3). For example, in an exemplary embodiment, the second display substrate 200 may include the second substrate 210 and the color control structure (e.g., the wavelength conversion layers WCL, the light-transmitting layer TPL, and the color filter layers CFL) which is disposed on a first surface of the second substrate 210 that faces the first substrate 110 (e.g., a bottom surface of the second substrate in the third direction DR3). The color control structure may include color filter layers CFL and wavelength conversion layers WCL. The color control structure may further include a light-transmitting layer TPL which is disposed in some pixels to be on a same level (e.g., distance from the second substrate 210 in the third direction DR3) as the wavelength conversion layers WCL.

A filling layer 300 may be disposed between the encapsulation structure 170 and the color control structure (e.g., in the third direction DR3). The filling layer 300 may bond the first and second display substrates 100 and 200 while filling the space between the first and second display substrates 100 and 200.

In an exemplary embodiment, the first substrate 110 of the first display substrate 100 may be an insulating substrate. The first substrate 110 may include a transparent material. For example, the first substrate 110 may include a transparent insulating material such as glass, quartz, etc. In an exemplary embodiment, the first substrate 110 may be a rigid substrate. However, exemplary embodiments of the present inventive concepts are not limited thereto. Alternatively, the first substrate 110 may include a plastic material such as polyimide and may have flexibility and the first substrate 110 may be bendable, foldable, or rollable.

A plurality of pixel electrodes PXE may be disposed on the first surface of the first substrate 110 (e.g., a top surface of the first substrate in the third direction DR3). The pixel electrodes PXE may be disposed in the respective pixels PX. The pixel electrodes PXE may be separated between adjacent pixels PX. For example, the pixel electrodes PXE may be spaced apart in the first direction DR1 and/or the second direction DR2. The circuit layer CCL, which drives the pixels PX, may be disposed on the first substrate 110. In an exemplary embodiment, the circuit layer CCL may be disposed between the first substrate 110 and the pixel electrodes PXE (e.g., in the third direction DR3). The circuit layer CCL will be described later in detail.

The pixel electrodes PXE may be the first electrodes of light-emitting elements, e.g., anode electrodes. In an exemplary embodiment, the pixel electrodes PXE may have a stack of a layer of a high-work function material such as indium tin oxide (ITO), indium zinc oxide (IZO), zinc oxide (ZnO), or indium oxide ($In_2O_3$) and a layer of a reflective material such as silver (Ag), magnesium (Mg), aluminum (Al), platinum (Pt), lead (Pd), gold (Au), nickel (Ni), neodymium (Nd), iridium (Ir), chromium (Cr), lithium (Li), calcium (Ca), or a mixture thereof. The high-work function material layer may be disposed on the reflective material layer to be closer than the reflective material layer to the emission layers EML. The pixel electrodes PXE may have a multilayer structure of ITO/Mg, ITO/MgF, ITO/Ag, or ITO/Ag/ITO. However, exemplary embodiments of the present inventive concepts are not limited thereto.

A pixel-defining film PDL may be disposed on the first surface of the first substrate 110 along the boundaries between the pixels PX. The pixel-defining film PDL may be disposed on the pixel electrodes PXE and may include openings which expose the pixel electrodes PXE to define an emission area EMA. A non-emission area NEM may be defined in the regions in which the pixel-defining film PDL covers the pixel electrodes PXE (e.g., the regions that do not include openings). In an exemplary embodiment, the pixel-defining film PDL may include an organic insulating material such as an acrylic resin, an epoxy resin, a phenolic resin, a polyamide resin, a polyimide resin, an unsaturated polyester resin, a polyphenylene ether resin, a polyphenylene sulfide resin, or benzocyclobutene (BCB). The pixel-defining film PDL may include an inorganic material. However, exemplary embodiments of the present inventive concepts are not limited thereto.

The emission layers EML are disposed on the pixel electrodes PXE exposed by the pixel-defining film PDL. For example, as shown in the exemplary embodiment of FIG. 2, a bottom surface of the emission layer EML may be disposed directly on a top surface of the pixel electrodes PXE. In an exemplary embodiment in which the display device 1 is an OLED display device, the emission layers EML may include an organic layer including an organic material. The organic layer may include an organic light-emitting layer and may further include a hole injection/transport layer and/or an electron injection/transport layer as auxiliary layers for assisting the emission of light. In an embodiment in which the display device 1 is a micro-LED display device or a nano-LED display device, the emission layers EML may include an inorganic material such as an inorganic semiconductor.

In some exemplary embodiments, each of the emission layers EML may have a tandem structure in which a plurality of organic light-emitting layers are stacked in a thickness direction (e.g., the third direction DR3) with charge generating layers disposed therebetween. In an exemplary embodiment, the organic light-emitting layers may emit light of the same wavelength or may emit light of different wavelengths. At least some of the layers of each of the emission layers EML may be separated between adjacent pixels PX.

The emission layers EML may all emit light of the same color in all the pixels PX. For example, the emission layers EML may emit blue light or ultraviolet (UV) light, and the wavelength conversion layers WCL of the color control structure may convert the light of the pixels PX to display different colors.

Alternatively, the wavelength of light emitted by each of the emission layers EML may differ from one pixel PX to another pixel PX. For example, in an exemplary embodiment, the emission layers EML may emit light of a first color in the first color pixel, light of a second color in the second color pixel, and light of a third color in the third color pixel.

A common electrode CME may be disposed on the emission layers EML. The common electrode CME may be in contact not only with the emission layers EML, but also with the top surface of the pixel-defining film PDL. For example, as shown in the exemplary embodiment of FIG. 2, a bottom surface of the common electrode CME may be disposed directly on top surfaces of the emission layers EML and the pixel-defining film PDL.

The common electrode CME may be connected throughout the pixels PX. For example, in an exemplary embodiment, the common electrode CME may extend along the entire surface of the first substrate 110 (e.g., in the first direction DR1) throughout each of the pixels PX. The common electrode CME may be the second electrode of each of the light-emitting elements (e.g., a cathode electrode). However, exemplary embodiments of the present inventive concepts are not limited thereto.

In an exemplary embodiment, the common electrode CME may include a layer of a low-work function material such as Li, Ca, LiF/Ca, LiF/Al, Al, Mg, Ag, Pt, Pd, Ni, Au Nd, Ir, Cr, BaF, Ba, or a compound or mixture thereof (e.g., a mixture of Ag and Mg). The common electrode CME may further include a transparent metal oxide layer which is disposed on the low-work function material layer.

The pixel electrodes PXE, the emission layers EML, and the common electrode CME may form the light-emitting elements (e.g., OLEDs). Light may be emitted upwardly from the emission layers EML through the common electrode CME.

The encapsulation structure 170 may be disposed on the common electrode CME. For example, as shown in the exemplary embodiment of FIG. 2, a bottom surface of the encapsulation structure 170 may be disposed directly on a top surface of the common electrode CME (e.g., in the third direction DR3). The encapsulation structure 170 may include at least one thin-film encapsulation layer. For example, the encapsulation structure 170 may include a first inorganic film 171, an organic film 172, and a second inorganic film 173. For example, as shown in the exemplary embodiment of FIG. 2, the first inorganic film 171, organic film 172 and second inorganic film 173 may be sequentially stacked on each other (e.g., in the third direction DR3). In an exemplary embodiment, the first and second inorganic films 171 and 173 may include silicon nitride, silicon oxide, or silicon oxynitride. The organic film 172 may include an organic insulating material such as an acrylic resin, an epoxy resin, a phenolic resin, a polyamide resin, a polyimide resin, an unsaturated polyester resin, a polyphenylene ether resin, a polyphenylene sulfide resin, or BCB. However, exemplary embodiments are not limited thereto.

The second display substrate 200 may be disposed on the encapsulation structure 170 to face the encapsulation structure 170 (e.g., in the third direction DR3). In an exemplary embodiment, the second substrate 210 of the second display substrate 200 may include a transparent material. For example, the second substrate 210 may include a transparent insulating material such as glass or quartz. The second substrate 210 may be a rigid structure. However, exemplary embodiments of the present inventive concepts are not limited thereto. For example, in an alternative exemplary embodiment, the second substrate 210 may include a plastic material such as polyimide and may have flexibility and the second substrate 210 may thus be bendable, foldable, or reliable.

The material, thickness, and transmissivity of the second substrate 210 may be the same as the first substrate 110 or may be different from the first substrate. For example, in an exemplary embodiment, the second substrate 210 may have a higher transmissivity than the first substrate 110 and may be thicker or thinner (e.g., a distance between a top surface and bottom surface thereof in the third direction DR3) than the first substrate 110.

A light-blocking member BML may be disposed on the first surface of the second substrate 210 (e.g., a bottom surface of the second substrate in the third direction DR3) along the boundaries between the pixels PX. The light-blocking member BML may overlap (e.g., in the third direction DR3) with the pixel-defining film PDL and may be located in the non-emission area NEM. The light-blocking member BML may include openings which expose portions of the first surface of the second substrate 210 that overlap with the emission areas EMA. The light-blocking member BML may be formed in a lattice shape in a plan view (e.g., when viewed from the third direction DR3).

In an exemplary embodiment, the light-blocking member BML may include an organic material. The light-blocking member BML absorbs external light and can thus reduce color distortions that may be caused by the reflection of external light. The light-blocking member BML can also prevent light emitted from the emission layers EML from infiltrating into adjacent pixels PX to increase image clarity.

The light-blocking member BML may absorb all visible wavelengths. The light-blocking member BML may include a light-absorbing material. For example, the light-blocking member BML may be formed of a material that is used as a black matrix.

Alternatively, the light-blocking member BML may absorb light of particular visible wavelengths and may transmit light of other wavelengths therethrough. For example, the light-blocking member BML may include the same material as the color filter layers CFL. For example, the light-blocking member BML may be formed of the same material as a blue color filter layer CFL3. In some exemplary embodiments, the light-blocking member BML may be integrally formed with the blue color filler layer CFL3.

In some exemplary embodiments, the display device 1 may not include the light-blocking member BML.

As shown in the exemplary embodiment of FIG. 2, the color filter layers CFL may be disposed on portions of the first surface of the second substrate 210 that are exposed by the openings of the light-blocking member BML. In an exemplary embodiment, the color filter layers CFL may also be disposed on the light-blocking member BML.

The color filter layers CFL may include a first color filter layer CFL1 which is disposed in the first color pixel PX, a second color filter layer CFL2 which is disposed in the second color pixel PX, and the third color filter layer CFL3 which is disposed in the third color pixel PX. Each of the first, second, and third color filter layers CFL1, CFL2, and CFL3 may include a colorant such as a pigment or dye capable of absorbing all wavelengths except for a particular wavelength. For example, the first, second, and third color filter layers CFL1, CFL2, and CFL3 may be red, green, and blue color filter layers, respectively. In the exemplary embodiment shown in FIG. 2, adjacent color filter layers CFL are illustrated as being spaced apart from one another (e.g., in the first direction DR1) over the light-blocking member BML. However, in some exemplary embodiments, the adjacent color filter layers CFL may partially overlap with one another over the light-blocking member BML.

A first capping layer 220 may be disposed on the color filter layers CFL. For example, as shown in the exemplary embodiment of FIG. 2, a top surface of the first capping layer 220 (e.g., in the third direction DR3) may directly contact a bottom surface of the color filter layers CFL. The first capping layer 220 can prevent impurities such as moisture, air and other contaminants from penetrating and contaminating the color filter layers CFL. The first capping layer 220 can prevent the diffusion of the colorants of the color filter layers CFL.

The first capping layer 220 may be in direct contact with first surfaces of the color filter layers CFL (e.g., the bottom surfaces of the color filter layers in the third direction DR3). In an exemplary embodiment, the first capping layer 220 may be formed of an inorganic material. For example, the first capping layer 220 may include silicon nitride, aluminum nitride, zirconium nitride, titanium nitride, hafnium nitride, tantalum nitride, silicon oxide, aluminum oxide, titanium oxide, tin oxide, or silicon oxynitride. However, exemplary embodiments of the present inventive concepts are not limited thereto.

A barrier wall PTL may be disposed on the first capping layer 220. The barrier wall PTL may be disposed in the non-emission area NEM. For example, as shown in the exemplary embodiment of FIG. 2, a top surface (e.g., in the third direction DR3) of the barrier wall PTL may directly contact a bottom surface (e.g., in the third direction DR3) of the first capping layer 220 in the non-emission area NEM. The barrier wall PTL may be disposed to overlap (e.g., in the third direction DR3) with the light-blocking member BML. The barrier wall PTL may include openings (e.g., extending in the first direction DR1) which expose the color filter layers CFL. In an exemplary embodiment, the barrier wall PTL may include a photosensitive organic material. However, exemplary embodiments of the present inventive concepts are not limited thereto. The barrier wall PTL may further include a light-shielding material.

The wavelength conversion layers WCL and/or the light-transmitting layer TPL may be disposed in spaces exposed by the openings of the barrier wall PTL. In an exemplary embodiment, the wavelength conversion layers WCL and the light-transmitting layer TPL may be formed by inkjet printing using the barrier walls PTL as banks. However, exemplary embodiments of the present inventive concepts are not limited thereto.

In an exemplary embodiment in which the emission layers EML emit light of the third color, the wavelength conversion layers WCL may include first and second wavelength conversion patterns WCL1 and WCL2 which are disposed in the first and second color pixels PX and PX, respectively. The light-transmitting layer TPL may be disposed in the third color pixel PX.

The first wavelength conversion pattern WCL1 may include a first base resin BRS1 and a first wavelength conversion material WCP1 which is disposed in the first base resin BRS1. The second wavelength conversion pattern WCL2 may include a second base resin BRS2 and a second wavelength conversion material WCP2 which is disposed in the second base resin BRS2. The light-transmitting layer TPL may include a third base resin BRS3 and a scatterer SCP which is disposed in the third base resin BRS3.

The first, second, and third base resins BRS1, BRS2, and BRS3 may include a light transmitting organic material. For example, in an exemplary embodiment, the first, second, and third base resins BRS1, BRS2, and BRS3 may include an epoxy resin, an acrylic resin, a cardo resin, or an imide resin. However, exemplary embodiments of the present inventive concepts are not limited thereto. The first, second, and third base resins BRS1, BRS2, and BRS3 may be formed of the same material. However, exemplary embodiments of the present inventive concepts are not limited thereto.

The scatterer SCP may be particles of a metal oxide or particles of an organic material. In an exemplary embodiment, the metal oxide may be titanium oxide ($TiO_2$), zirconium oxide ($ZrO_2$), aluminum oxide ($Al_2O_3$), indium oxide ($In_2O_3$), zinc oxide (ZnO), or tin oxide ($SnO_2$), and the organic material may be an acrylic resin or a urethane resin.

The first wavelength conversion material WCP1 may convert the first color into the third color, and the second wavelength conversion material WCP2 may convert the third color into the second color. The first and second wavelength conversion materials WCP1 and WCP2 may be quantum dots, quantum rods, or phosphors. In an exemplary embodiment, the quantum dots may include a group IV nanocrystal material, a group II-VI compound nanocrystal material, a group III-V compound nanocrystal material, a group IV-VI nanocrystal material, or a combination thereof. Each of the first and second wavelength conversion patterns WCL1 and WCL2 may further include a scatterer SCP which improves the wavelength conversion efficiency of the first and second wavelength conversion patterns WCL1 and WCL2.

The light-transmitting layer TPL, which is disposed in the third color pixel, transmits therethrough light of the third color incident thereupon from the emission layers EML while maintaining the wavelength of the incident light. The scatterer SCP of the light-transmitting layer TPL may control the path of light emitted through the light-transmitting layer TPL. The light-transmitting layer TPL may not include a wavelength conversion material.

A second capping layer 230 may be disposed on the wavelength conversion layers WCL and the light-transmitting layer TPL. For example, as shown in the exemplary embodiment of FIG. 2, a top surface (e.g., in the third direction DR3) of the second capping layer 230 may directly contact a bottom surface (e.g., in the third direction DR3) of the wavelength conversion layers WCL and light transmission layer TPL. In an exemplary embodiment, the second capping layer 230 may be formed of an inorganic material. The second capping layer 230 may include one selected from among the aforementioned inorganic materials for forming the first capping layer 220. For example, the second capping layer 230 may be formed of the same material as the first capping layer 220. However, exemplary embodiments of the present inventive concepts are not limited thereto.

The filling layer 300 may be disposed between the first and second display substrates 100 and 200 (e.g., in the third direction DR3). The filling layer 300 may fill the space between the first and second display substrates 100 and 200 and may bond the first and second display substrates 100 and 200 to each other. The filling layer 300 may be disposed between the encapsulation structure 170 of the first display substrate 100 and the second capping layer 230 of the second display substrate 200. For example, as shown in the exemplary embodiment of FIG. 2, a bottom surface (e.g., in the third direction DR3) of the second capping layer 230 may directly contact a top surface (e.g., in the third direction DR3) of the filling layer 300 and a top surface (e.g., in the third direction DR3) of the encapsulation structure 170 may directly contact a bottom surface (e.g., in the third direction DR3) of the filling layer 300. In an exemplary embodiment, the filling material 300 may be formed of a Si-based organic material or an epoxy-based organic material. However, exemplary embodiments of the present inventive concepts are not limited thereto.

The circuit layer CCL of the display device 1 will hereinafter be described.

Figure 3:
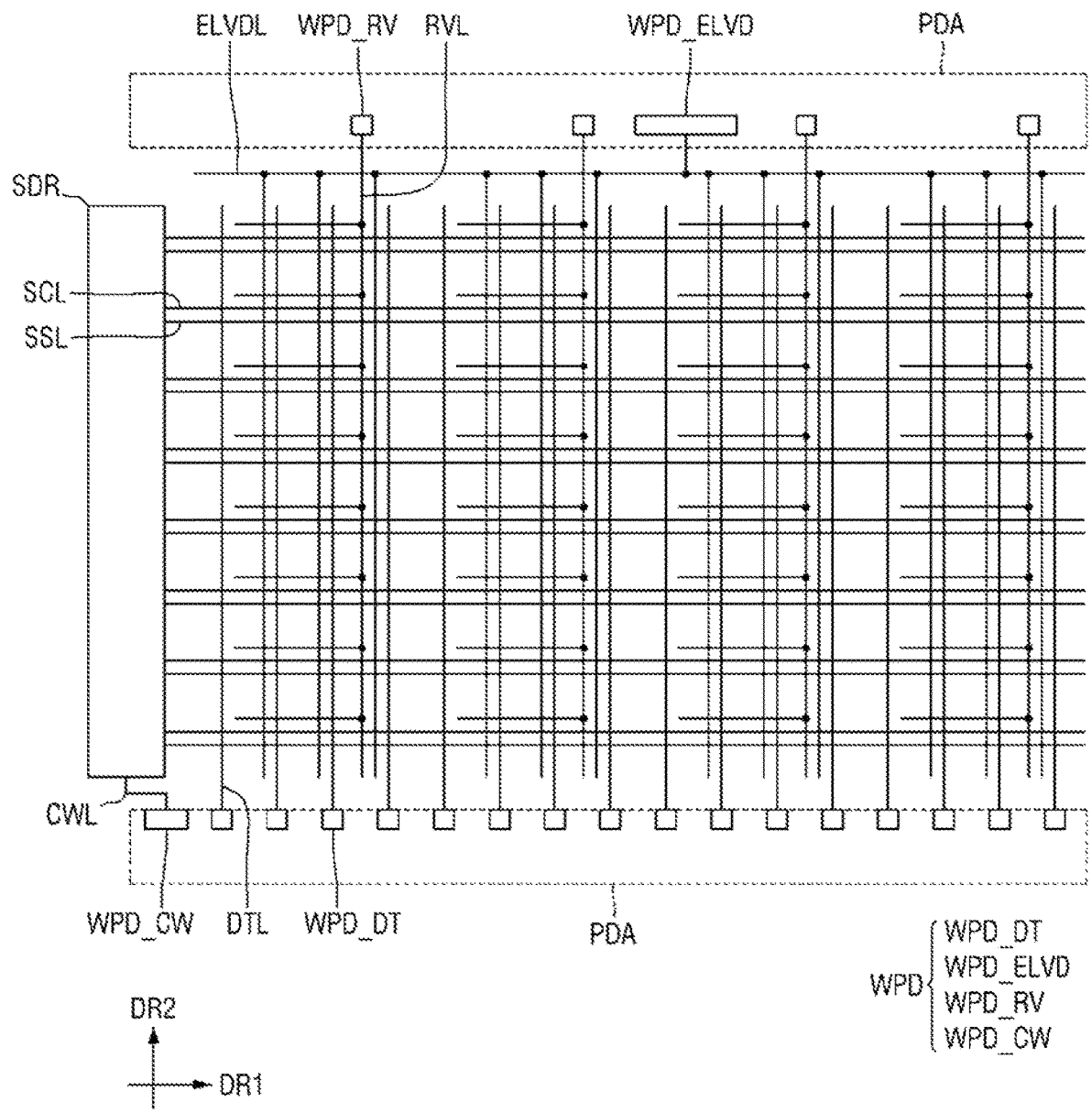
FIG. 3 is a layout view of a circuit layer of a first display substrate of the display device of FIG. 1 according to an exemplary embodiment of the present inventive concepts.

FIG. 3 is a layout view of the circuit layer of the first display substrate of the display device of FIG. 1.

Referring to FIG. 3, a plurality of wires are disposed on the first substrate 110. The wires include scan lines SCL, sensing signal lines SSL, data lines DTL, reference voltage lines RVL, and a first power supply line ELVDL.

The scan lines SCL and the sensing signal lines SSL may extend in a first direction DR1. The scan lines SCL and the sensing signal lines SSL may be connected to the scan driving unit SDR. The scan driving unit SDR may include driving circuitry which consists of the circuit layer CCL. In an exemplary embodiment, the scan driving unit SDR may be disposed in the third non-display area of the first substrate 110 (e.g., the portion of the non-display area on the left side of the display device 1 in the first direction DR1). However, exemplary embodiments of the present inventive concepts are not limited thereto. Alternatively, the scan driving unit SDR may be disposed in the fourth non-display area (e.g., the portion of the non-display area on the right side of the display device 1 in the first direction DR1) or in both the third and fourth non-display areas. The scan driving unit SDR may be connected to a signal connecting wire CWL, and at least a first end of the signal connecting wire CWL may form a pad WPD_CW in the first non-display area and/or in the second non-display area and may thus be connected to the external devices EXD of FIG. 1.

The data lines DTL and the reference voltage lines RVL may extend in the second direction DR2 which intersects the first direction DR1. The first power supply line ELVDL may include portions extending in the first direction DR1. The first power supply line ELVDL may further include portions extending in the second direction DR2. In an exemplary embodiment, the first power supply line ELVDL may have a mesh structure. However, exemplary embodiments of the present inventive concepts are not limited thereto.

Wire pads WPD may be disposed at least at first ends of the data lines DTL, of the reference voltage lines RVL, and of the first power supply line ELVDL. The wire pads WPD may be disposed in the non-emission area NDA. In the exemplary embodiment shown in FIG. 3, wire pads WPD_DT (hereinafter, the data pads WPD_DT) of the data lines DTL may be disposed in the first non-display area, and wire pads WPD_RV (hereinafter, the reference voltage pads WPD_RV) of the reference voltage lines RVL and a wire pad WPD_ELVD (hereinafter, the first power supply pad WPD_ELVD) of the first power supply line ELVDL may be disposed in the second non-display area. However, exemplary embodiments of the present inventive concepts are not limited thereto. For example, in another exemplary embodiment, the data pads WPD_DT, the reference voltage pads WPD_RV, and the first power supply pad WPD_ELVD may all be disposed in the same area (e.g., in the first non-display area). The external devices EXD of FIG. 1 may be mounted on the wire pads WPD. In an exemplary embodiment, the external devices EXD may be mounted on the wire pads WPD via anisotropic conductive films or via ultrasonic bonding.

The pixels PX on the first substrate 110 include pixel driving circuits. The aforementioned wires may pass through or around the pixels PX to apply driving signals to the pixel driving circuits. Each of the pixel driving circuits may include at least one transistor and at least one capacitor. The numbers of transistors and capacitors provided in each of the pixel driving circuits may vary. The pixel driving circuits will hereinafter be described as having a "3T1C" structure having three transistors and one capacitor. However, exemplary embodiments of the present inventive concepts are not limited thereto and the positioning of the wire pads WPD may vary. For example, the pixel driving circuits of the pixels PX may include various other structures such as a "2T1C" structure (e.g., having two transistors and one capacitor), a "7T1C" structure (e.g., having seven transistors and one capacitor), a "6T1C" structure (e.g., having six transistors and one capacitor), etc.

Figure 4:
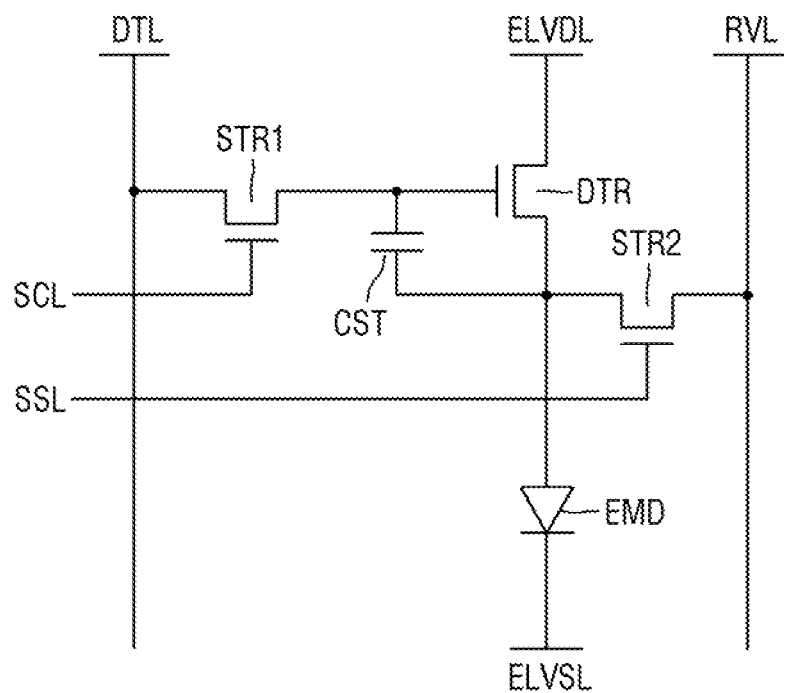
FIG. 4 is an equivalent circuit diagram of a pixel of the display device of FIG. 1 according to an exemplary embodiment of the present inventive concepts.

FIG. 4 is an equivalent circuit diagram of a pixel of the display device of FIG. 1.

Referring to FIG. 4, a pixel PX of the display device 1 includes a light-emitting element EMD, three transistors (e.g., a driving transistor DTR, a first switching transistor STR1, and a second switching transistor STR2), and a storage capacitor CST.

The light-emitting element EMD emits light in accordance with a current supplied thereto via the driving transistor DTR. In an exemplary embodiment, the light-emitting element EMD may be implemented as an OLED, a micro-LED, or a nano-LED.

The first electrode (e.g., the anode electrode) of the light-emitting element EMD may be connected to the source electrode of the driving transistor DTR, and the second electrode (e.g., the cathode electrode) of the light-emitting element EMD may be connected to a second power supply line ELVSL to which a low-potential voltage (e.g., a second power supply voltage) is supplied. The second power supply voltage may be lower than a high-potential voltage applied to the first power supply line ELVDL, (e.g., a first power supply voltage).

The driving transistor DTR controls a current that flows from the first power supply line ELVDL to the light-emitting element EMD, in accordance with the difference in voltage between the gate and source electrodes of the driving transistor DTR. The gate electrode of the driving transistor DTR may be connected to the first source/drain electrode of a first switching transistor STR1. The source electrode of the driving transistor DTR may be connected to the first electrode of the light-emitting element EMD, and the drain electrode of the driving transistor DTR may be connected to the first power supply line ELVDL to which the first power supply voltage is applied.

The first switching transistor STR1 is turned on by a scan signal from a scan line SCL to connect a data line DTL to the gate electrode of the driving transistor DTR. The gate electrode of the first switching transistor STR1 may be connected to the scan line SCL. The first source/drain electrode of the first switching transistor STR1 may be connected to the gate electrode of the driving transistor DTR, and the second source/drain electrode of the first switching transistor STR1 may be connected to the data line DTL.

A second switching transistor STR2 is turned on by a sensing signal from a sensing signal line SSL to connect a reference voltage line RVL to the source electrode of the driving transistor DTR. The gate electrode of the second switching transistor STR2 may be connected to the sensing signal line SSL. The first source/drain electrode of the second switching transistor STR2 may be connected to the reference voltage line RVL, and the second source/drain electrode of the second switching transistor STR2 may be connected to the source electrode of the driving transistor DTR.

In an exemplary embodiment, the first source/drain electrodes of the first and second switching transistors STR1 and STR2 may be source electrodes, and the second source/drain electrodes of the first and second switching transistors STR1 and STR2 may be drain electrodes. However, exemplary embodiments of the present inventive concepts are not limited thereto. For example, in an alternative embodiment, the first source/drain electrodes of the first and second switching transistors STR1 and STR2 may be drain electrodes, and the second source/drain electrodes of the first and second switching transistors STR1 and STR2 may be source electrodes.

The storage capacitor CST is formed between the gate electrode and the source electrode of the driving transistor DTR. The storage capacitor CST stores the differential voltage between the gate and source voltages of the driving transistor DTR.

The driving transistor DTR and the first and second switching transistors STR1 and STR2 may be formed as thin-film transistors (TFTs). FIG. 3 illustrates that the driving transistor DTR and the first and second switching transistors STR1 and STR2 are N-type metal oxide semiconductor field effect transistors (MOSFETs). However, exemplary embodiments of the present inventive concepts are not limited thereto. For example, in an alternative embodiment, the driving transistor DTR and the first and second switching transistors STR1 and STR2 may be formed as P-type MOSFETs. In another exemplary embodiment, at least one of the driving transistor DTR and the first and second switching transistors STR1 and STR2 may be formed as an N-type MOSFET, and the other transistors may be formed as a P-type MOSFET.

Figure 5:
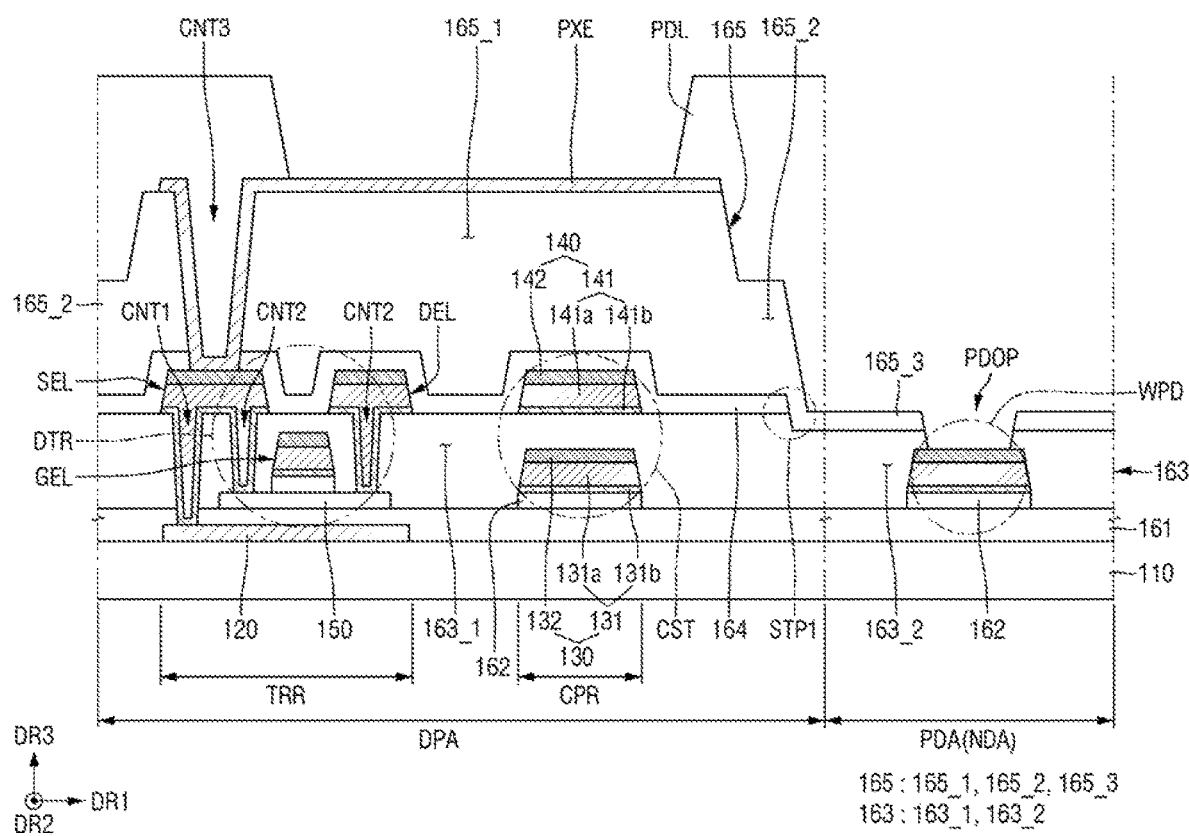
FIG. 5 is a cross-sectional view of the first display substrate of the display device of FIG. 1 according to an exemplary embodiment of the present inventive concepts.

FIG. 5 is a cross-sectional view of the first display substrate of the display device of FIG. 1. Specifically, FIG. 5 is a cross-sectional view illustrating a portion of the display area DPA, particularly, a transistor region TRR and a capacitor region CPR of a pixel PX, and a portion of the non-display area NDA, particularly, a pad area PDA. The transistor region TRR of FIG. 5 is a region where a driving transistor DTR is disposed. FIG. 5 illustrates mainly the circuit layer CCL of the first display substrate 100 and illustrates only up to the pixel-defining film PDL of the first display substrate 100 for convenience.

Referring to FIG. 5, the circuit layer CCL may include a semiconductor layer 150, a plurality of conductive layers, and a plurality of insulating layers which are disposed on the first substrate 110. In an exemplary embodiment, the semiconductor layer 150 may include an oxide semiconductor. In an exemplary embodiment, the plurality of conductive layers may include a lower metal layer 120, a gate conductive layer 130, a data conductive layer 140, and a pixel electrode PXE. In an exemplary embodiment, the plurality of insulating layers may include a buffer layer 161, a gate insulating film 162, an interlayer insulating film 163, a passivation film, and a via layer 165.

The lower metal layer 120 may be disposed on the first substrate 110. For example, as shown in the exemplary embodiment of FIG. 5, the lower metal layer 120 may be disposed directly on the first substrate 110 (e.g., in the third direction DR3). The lower metal layer 120 may be a light-shielding layer protecting the semiconductor layer 150 against external light. The lower metal layer 120 may have a patterned shape. The lower metal layer 120 may be disposed in the transistor region TRR. The lower metal layer 120 may be disposed to cover at least the channel region of the semiconductor layer 150 from below the semiconductor layer 150 or to cover the entire semiconductor layer 150. The lower metal layer 120 may be electrically connected to a source electrode SEL of the driving transistor DTR via a first contact hole CNT1 to suppress the variation of the voltage of the driving transistor DTR. In an exemplary embodiment, the lower metal layer 120 may be formed as a double layer consisting of a stack of a titanium (Ti) layer and a copper (Cu) layer. However, exemplary embodiments of the present inventive concepts are not limited thereto.

The buffer layer 161 is disposed on the lower metal layer 120. The buffer layer 161 may be disposed to cover the entire surface of the first substrate 110 where the lower metal layer 120 is formed. For example, as shown in the exemplary embodiment of FIG. 5, the buffer layer 161 may be disposed directly on top surfaces of the lower metal layer 120 and the first substrate 110 (e.g., in the third direction DR3). In an exemplary embodiment, the buffer layer 161 may include silicon nitride, silicon oxide, or silicon oxynitride. The buffer layer 161 may include a double layer of SiNx/SiOx. However, exemplary embodiments of the present inventive concepts are not limited thereto.

The semiconductor layer 150 is disposed on the buffer layer 161. For example, as shown in the exemplary embodiment of FIG. 5, the semiconductor layer 150 may be disposed directly on the buffer layer 161 (e.g., in the third direction DR3). The semiconductor layer 150 is disposed in the transistor region TRR and forms the channel of the transistor DTR. In an exemplary embodiment the semiconductor layer 150 may include an oxide semiconductor. The oxide semiconductor may include a binary compound (ABx), a ternary compound (ABxCy), or a quaternary compound (ABxCyDz) containing, for example, indium (In), zinc (Zn), gallium (Ga), tin (Sn), Ti, Al, hafnium (Hf), zirconium (Zr), or magnesium (Mg). For example, the semiconductor layer 150 may include indium tin zinc oxide (IGZO). However, exemplary embodiments of the present inventive concepts are not limited thereto.

The gate insulating film 162 is disposed on the semiconductor layer 150. In an exemplary embodiment, the gate insulating film 162 may be formed into the same pattern as the gate conductive layer 130. For example, the sidewalls of the gate insulating film 162 may be aligned substantially with the sidewalls of the gate conductive layer 130. However, exemplary embodiments of the present inventive concepts are not limited thereto. The gate insulating film 162 may include a silicon compound or a metal oxide. For example, the gate insulating film 162 may include silicon oxide, silicon nitride, silicon oxynitride, aluminum oxide, tantalum oxide, hafnium oxide, zirconium oxide, or titanium oxide. For example, the gate insulating film 162 may include a SiOx film. However, exemplary embodiments of the present inventive concepts are not limited thereto.

The gate conductive layer 130 is disposed on the gate insulating film 162. For example, as shown in the exemplary embodiment of FIG. 5, the gate conductive layer 130 may be disposed directly on the gate insulating film 162 (e.g., in the third direction DR3). The gate electrode GEL in the transistor region TRR, a first electrode (or a lower electrode) of a capacitor in the capacitor region CPR, and a wire pad WPD in the pad area PDA may be formed of the gate conductive layer 130. The scan line SCL and the sensing signal line SSL of FIG. 4 may also be formed of the gate conductive layer 130.

The gate conductive layer 130 may include a gate conductive metal layer 131 and a gate capping layer 132 which is disposed on the gate conductive metal layer 131. In an exemplary embodiment, the gate conductive metal layer 131 may be formed as a single-layer film or as a multilayer film. For example, the gate conductive metal layer 131 may include a gate main metal layer 131a and a gate base layer 131b which is disposed below the gate main metal layer 131a. As shown in the exemplary embodiment of FIG. 5, a top surface of the gate base layer 131b may directly contact a bottom surface of the gate main metal layer 131a. A bottom surface of the gate capping layer 132 may be directly contact a top surface of the gate conductive metal layer 131. The gate base layer 131b, the gate main metal layer 131a, and the gate capping layer 132 may all be formed of a conductive material. In an exemplary embodiment, the gate base layer 131b, the gate main metal layer 131a, and the gate capping layer 132 may be patterned by a single mask process. For example, the sidewalls of the gate base layer 131b, the sidewalls of the gate main metal layer 131*a*, and the sidewalls of the gate capping layer 132 may be aligned. In some exemplary embodiments, an upper layer of the gate conductive layer 130 may not protrude beyond a lower layer of the gate conductive layer 130. For example, the gate conductive layer 130 may not include a tip structure protruding at the top. In this embodiment, the sidewalls of the lower layer of the gate conductive layer 130 may be aligned with, or protrude outwardly beyond (e.g., in the first direction DR1), the corresponding sidewalls of the upper layer of the gate conductive layer 130. The gate conductive layer 130 may not include insulating layers interposed between the layers of the gate conductive layer that overlap with each other in the thickness direction (e.g., in the third direction DR3).

The gate base layer 131*b* may help the film forming characteristics (such as adhesion) of the gate main metal layer 131*a* or may prevent a reactive material from the gate insulating film 162 from penetrating the gate main metal layer 131*a*. The gate main metal layer 131*a* may also prevent the material of the gate main metal layer 131*a* (e.g., Cu) from diffusing into the layers disposed therebelow. In an exemplary embodiment, the gate base layer 131*b* may include a material such as Ti, tantalum (Ta), Ca, Cr, Mg, or Ni. However, exemplary embodiments of the present inventive concepts are not limited thereto.

The gate main metal layer 131*a* may transmit signals and may be formed of a low-resistance material. The gate main metal layer 131*a* may have a greater thickness (e.g., length in the third direction DR3) than the gate base layer 131*b* and the gate capping layer 132 and may be formed of a material having a lower resistance than the gate base layer 131*b* and the gate capping layer 132. In an exemplary embodiment, the gate main metal layer 131*a* may include a material such as Cu, Mo, Al, or Ag. However, exemplary embodiments of the present inventive concepts are not limited thereto.

The gate capping layer 132 covers and protects the gate main metal layer 131*a* from above the gate main metal layer 131*a*. The gate capping layer 132 may protect the gate main metal layer 131*a* from etchants or other chemicals used in the formation of layers or elements above the gate conductive layer 130. The gate capping layer 132 may also prevent the material of the gate main metal layer 131*a* (e.g., Cu) from diffusing into the layers disposed thereabove. The gate capping layer 132 may be in direct contact with the gate main metal layer 131*a*.

The gate capping layer 132 may provide the contact electrode of the wire pad WPD in the pad area PDA. Therefore, the gate capping layer 123 may be formed of a material suitable for use as the contact electrode of the wire pad WPD. In an exemplary embodiment, the gate capping layer 132 may include at least one compound selected from zinc indium oxide (ZIO), IZO, and ITO. For example, the gate capping layer 132 may include a ZIO film, an IZO film, or an ITO film or may be formed as a multilayer film of Ti/Mo/ITO.

For example, the gate conductive layer 130 may include a gate base layer 131*b* containing Ti, a gate main metal layer 131*a* containing Cu, and a gate capping layer 132 containing ZIO. Accordingly, the gate conductive layer 130 may include a triple layer of Ti/Cu/ZIO. In an embodiment in which the gate capping layer 132 is formed of ZIO, the gate capping layer 132 and the underlying Cu layer can be etched together without generating any upper tips, and the gate capping layer 132 can be properly used as the contact electrode of the wire pad WPD. In another exemplary embodiment, the gate conductive layer 130 may be formed as a triple layer of Ti/Mo/ITO, in which case, the gate conductive layer 130 may have a stack of Ti/Cu/Ti/Mo/ITO.

Since the gate conductive layer 130 includes the gate capping layer 132 at a top portion, the corrosion of the gate main metal layer 131*a* of the gate conductive metal layer 131 can be prevented. Accordingly, the reliability of the wire pad WPD is improved.

The interlayer insulating film 163 is disposed on the gate conductive layer 130. For example, as shown in the exemplary embodiment of FIG. 5, the interlayer insulating film 163 is disposed directly on the gate conductive layer 130, including the gate capping layer 132 disposed on the gate electrode GEL in the transistor region TRR, the first electrode of the capacitor in the capacitor region CPR and a portion of the wire pad WPD in the pad area PDA. In an exemplary embodiment, the interlayer insulating film 163 may include an inorganic insulating material such as silicon oxide, silicon nitride, silicon oxynitride, hafnium oxide, aluminum oxide, titanium oxide, tantalum oxide, or zinc oxide. For example, the interlayer insulating film 163 may include SiON. However, exemplary embodiments of the present inventive concepts are not limited thereto.

The interlayer insulating film 163 may include portions having different heights (e.g., the distance in the third direction DR3 from a top surface of the interlayer insulating film 163 to a top surface of the first substrate 110). For example, the interlayer insulating film 163 may include a first portion 163_1 in the display area DPA and a second portion 163_2 in the non-display area NDA. The second portion 163_2 may have a smaller thickness and a smaller height than the first portion 163_1. The second portion 163_2 of the interlayer insulating film 163 may be located in the non-display area NDA, such as at least near a portion of the gate conductive layer 130 in the pad area PDA. A first stepped portion STP1 may be defined between the first and second portions 163_1 and 163_2. The first stepped portion STP1 may be aligned with a side of a passivation layer 164. However, exemplary embodiments of the present inventive concepts are not limited thereto. In exemplary embodiments in which the interlayer insulating film 163 is relatively thin in the portion of the pad area PDA near the gate conductive layer 130, the contact electrode of the wire pad WPD, such as the gate capping layer 132, may be easily exposed. The interlayer insulating film 163 is illustrated as having a flat top surface (e.g., planar in the first direction DR1) in the display area DPA. However, exemplary embodiments of the present inventive concepts are not limited thereto. Alternatively, the interlayer insulating film 163 may have a surface shape reflecting any underlying stepped structure. In this embodiment, the thicknesses of portions of the interlayer insulating film 163 as measured from the same flat reference surface (e.g., the top surface of the first substrate 110) where there does not exist any underlying stepped structure may be compared.

The data conductive layer 140 is disposed on the interlayer insulating film 163. For example, as shown in the exemplary embodiment of FIG. 5, a bottom surface of the data conductive layer 140 may be disposed directly on a top surface of the interlayer insulating film 163. The source electrode SEL and a drain electrode DEL in the transistor region TRR and the second electrode (or the upper electrode) of the capacitor in the capacitor region CPR may consist of the data conductive layer 140. The source electrode SEL and the drain electrode DEL in the transistor region TRR may be connected to the semiconductor layer 150 through second contact holes CNT2 which penetrate the interlayer insulating film 163. The source electrode SEL may be connected to the buffer layer 161 via a first contact hole CNT1 which penetrates the interlayer insulating film 163 and the buffer layer 161. The data line DTL, a reference voltage line RVL, and a first power supply line ELVDL may consist of the data conductive layer 140. The data conductive layer 140 may not overlap (e.g., in the third direction DR3) with the portion of the gate conductive layer 130 in the pad area PDA. For example, as shown in the exemplary embodiment of FIG. 5, the data conductive layer 140 may not be formed in the pad area PDA. However, exemplary embodiments of the present inventive concepts are not limited thereto. For example, in some exemplary embodiments, the data conductive layer may be formed in the pad area PDA but may not overlap with the portion of the gate conductive layer 130 in the pad area PDA.

The data conductive layer 140 may include a data conductive metal layer 141 and a data capping layer 142 which is disposed on the data conductive metal layer 141. The data conductive metal layer 141 may be formed as a single-layer film or as a multilayer film. For example, the data conductive metal layer 141 may include a data main metal layer 141a and a data base layer 141b which is disposed below the data main metal layer 141a. The data base layer 141b, the data main metal layer 141a, and the data capping layer 142 may all be formed of a conductive material. As shown in the exemplary embodiment of FIG. 5, the data main metal layer 141a may be disposed directly on the data base layer 141b (e.g., in the third direction DR3) and the data capping layer 142 may be disposed directly on the data main metal layer 141a (e.g., in the third direction DR3). No insulating layers may be interposed between the layers of the data conductive layer 140 that overlap with each other in the thickness directions (e.g., in the third direction DR3). In an exemplary embodiment, the data base layer 141b, the data main metal layer 141a, and the data capping layer 142 may be patterned by a single mask process. The shape of the sidewalls of the data conductive layer 140 may be substantially the same as the shape of the sidewalls of the gate conductive layer 130.

The data base layer 141b may help the film forming characteristics (such as adhesion) of the data main metal layer 141a or may prevent a reactive material from the interlayer insulating film 163 from penetrating the data main metal layer 141a. In an exemplary embodiment, the data base layer 141b may include a material such as Ti, Ta, Ca, Cr, Mg, or Ni. However, exemplary embodiments of the present inventive concepts are not limited thereto.

The data main metal layer 141a may transmit signals and may be formed of a low-resistance material. In an exemplary embodiment, the data main metal layer 141a may have a greater thickness (e.g., length in the third direction DR3) than the data base layer 141b and the data capping layer 142 and may be formed of a material having a lower resistance than the data base layer 141b and the data capping layer 142. In an exemplary embodiment, the data main metal layer 141a may include a material such as Cu, Mo, Al, or Ag. However, exemplary embodiments of the present inventive concepts are not limited thereto.

In an exemplary embodiment, the data capping layer 142 covers and protects the data main metal layer 141a from above the data main metal layer 141a. The data capping layer 142 may protect the data main metal layer 141a from etchants or other chemicals used in the formation of layers or elements above the data conductive layer 140 (e.g., in the formation of a third contact hole CNT3). The data capping layer 142 may also prevent the via layer 165 from being in direct contact with the data main metal layer 141a and may thus prevent the data main metal layer 141a from being corroded by the material of the via layer 165. The data capping layer 142 may also prevent the material of the data main metal layer 141a (e.g., Cu) from diffusing into the layers disposed thereabove. The data capping layer 142 may be in direct contact with the data main metal layer 141a.

The data capping layer 142 may include ZIO, IZO, or ITO. For example, the data capping layer 142 may include a ZIO film, an IZO film, or an ITO film or may be formed as a multilayer film of Ti/Mo/ITO.

For example, the data conductive layer 140 may include a triple layer of Ti/Cu/ZIO or may have a stack of Ti/Cu/Ti/Mo/ITO. The data conductive layer 140 and the gate conductive layer 130 may include the same materials and have the same stack structure. However, exemplary embodiments of the present inventive concepts are not limited thereto.

The passivation layer 164 is disposed on the data conductive layer 140. For example, as shown in the exemplary embodiment of FIG. 5, the passivation layer 164 may be disposed directly on the data conductive layer 140 (e.g., in the third direction DR3). The passivation layer 164 covers and protects the data conductive layer 140. In an exemplary embodiment, the passivation layer 164 may include an inorganic insulating material such as silicon oxide, silicon nitride, silicon oxynitride, hafnium oxide, aluminum oxide, titanium oxide, tantalum oxide, or zinc oxide. However, exemplary embodiments of the present inventive concepts are not limited thereto. In an exemplary embodiment, the passivation layer 164 may be formed in the display area DPA and may not be formed in at least a portion of the non-display area NDA. The passivation layer 164 may not be formed on, and thus may not overlap with, the portion of the gate conductive layer 130 in the pad area FDA. For example, the passivation layer 164 may not overlap with the second portion 163_2 of the interlayer insulating film 163, which is relatively thin in the pad area PDA. As shown in the exemplary embodiment of FIG. 5, a lateral end (or a lateral side) of the passivation layer 164 (e.g., in the first direction DR1) may be aligned with the first stepped portion STP1 of the interlayer insulating film 163.

The via layer 165 is disposed on the passivation layer 164. The via layer 165 may be disposed to cover the top surface of the passivation layer 164 and a side of the passivation layer 164 adjacent to the pad area PDA. In the pad area PDA, the via layer 165 may be disposed directly on the passivation layer 164 (e.g., in the third direction DR3). As shown in the exemplary embodiment of FIG. 5, the via layer 165 may also be disposed directly on the passivation layer 164 (e.g., in the third direction DR3) in the display area DPA.

In an exemplary embodiment, the via layer 165 may include an organic insulating material such as an acrylic resin, an epoxy resin, a phenolic resin, a polyamide resin, a polyimide resin, an unsaturated polyester resin, a polyphenylene ether resin, a polyphenylene sulfide resin, or BCB. The via layer 165 may further include a photosensitive material. For example, the via layer 165 may include polyimide. However, exemplary embodiments of the present inventive concepts are not limited thereto.

The via layer 165 may be stepped. For example, the via layer 165 may have a stepped structure having different heights (e.g., the distance in the third direction DR3 from a top surface of the via layer 165 to a top surface of the first substrate 110) in different regions. The via layer 165 may include a first region 165_1 having a first height, a second region 165_2 having a second height which is smaller than the first height, and a third region 165_3 having a third height which is smaller than the second height. The height of the via layer 165 may be measured from a reference surface such as a top surface of the first substrate 110. The via layer 165 may generally have a flat surface regardless of the presence and the shape of patterns formed therebelow. The via layer 165 may be stepped at each of the boundaries between different regions.

The first and second regions 165_1 and 165_2 of the via layer 165 may be located in the display area DPA. The first region 165_1 of the via layer 165 may overlap (e.g., in the third direction DR3) with the pixel electrode PXE. The second region 165_2 of the via layer 165 may be located in the non-emission area NEM of the display area DPA and may not overlap (e.g., in the third direction DR3) with the pixel electrode PXE. The second region 165_2 of the via layer 165 may be disposed along the periphery of the pixel electrode PXE and may form a lattice-shaped recess in the display area DPA (e.g., in a plan view from the third direction DR3).

The third region 165_3 of the via layer 165 may be located in the pad area PDA of the non-display area NDA. Since the via layer 165 is relatively thin in the pad area PDA, an external device can be easily and effectively mounted on the wire pad WPD which consists of the gate conductive layer 130. The third region 165_3 of the via layer 165 may be disposed to overlap with the second portion 163_2 of the interlayer insulating film 163.

The via layer 165 may form, together with the passivation layer 164, a pad opening PDOP which exposes the portion of the gate conductive layer 130 in the pad area PDA, such as the gate capping layer 132. As shown in the exemplary embodiment of FIG. 5, the passivation layer 164 and the via layer 165, which form the inner sidewalls of the pad opening PDOP, may be aligned with each other in the pad opening PDOP. However, exemplary embodiments of the present inventive concepts are not limited thereto. The inner sidewalls of the pad opening PDOP may be disposed to overlap with the gate conductive layer 130 (e.g., in the third direction DR3).

The pixel electrode PXE is disposed on the via layer 165. As shown in the exemplary embodiment of FIG. 5, the pixel electrode PXE may be disposed directly on the via layer 165 (e.g., in the third direction DR3). The material of the pixel electrode PXE is as described above with reference to FIG. 2. For example, the pixel electrode PXE may include a triple film of ITO/Ag/ITO.

In an exemplary embodiment, the pixel electrode PXE may be located in the display area DPA and may not be located in the non-display area NDA. The pixel electrode PXE may overlap (e.g., in the third direction DR3) with the transistor region TRR and the capacitor region CPR of the display area DPA. However, exemplary embodiments of the present inventive concepts are not limited thereto. The pixel electrode PXE may be connected to the source electrode SEL of the driving transistor DTR via the third contact hole CNT3, which penetrates the via layer 165 and the passivation layer 164.

The pixel-defining film PDL is disposed on the pixel electrode PXE. For example, as shown in the exemplary embodiment of FIG. 5, the pixel-defining film PDL may be disposed directly on the pixel electrode PXE (e.g., in the third direction DR3). The material of the pixel-defining film PDL is as described above with reference to FIG. 2. For example, the pixel-defining film PDL may include polyimide.

The pixel-defining film PDL may be located in the display area DPA and may not be located in the non-display area NDA. The pixel-defining film PDL may be disposed to overlap (e.g., in the third direction DR3) with the lateral edges of the pixel electrode PXE. The pixel-defining film PDL may be disposed above the third contact hole CNT3 to overlap with the third contact hole CNT3 (e.g., in the third direction DR3). As shown in the exemplary embodiment of FIG. 5, the pixel-defining film PDL may completely fill the inside of the third contact hole CNT3. The pixel-defining film PDL may be disposed on a portion of the via layer 165 where the pixel electrode PXE is not formed. The pixel-defining film PDL may fill the space (or the recess) formed by the height differences between the first region 165_1 and the second region 165_2 of the via layer 165. For example, the height of a portion of the pixel-defining film PDL overlapping with the first region 165_1 of the via layer 165 may be the same as the height of a portion of the pixel-defining film PDL overlapping with the second region 165_2 of the via layer 165. However, exemplary embodiments of the present inventive concepts are not limited thereto.

A method of fabricating the semiconductor device of FIG. 5 will hereinafter be described.

FIGS. 6 through 15 are cross-sectional views illustrating processes of the method of fabricating the display device of FIG. 5.

Figure 6:
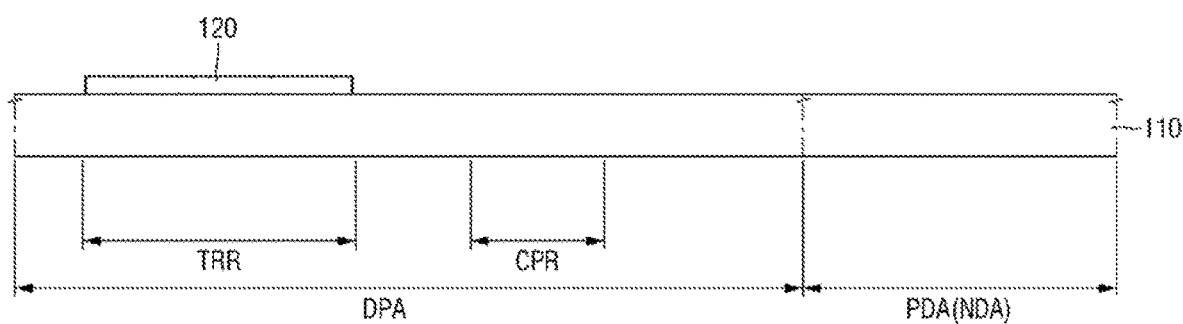
FIGS. 6 through 15 are cross-sectional views illustrating processes of a method of fabricating the display device of FIG. 5 according to exemplary embodiments of the present inventive concepts.

Referring to FIG. 6, the lower metal layer 120, which is patterned, is formed on the first substrate 110. In an exemplary embodiment, the lower metal layer 120 may be formed by a mask process. For example, a material layer for forming the lower metal layer 120 may be deposited on the entire surface of the first substrate 110 and may then be patterned by photolithography, thereby forming the lower metal layer 120, as illustrated in FIG. 6.

Figure 7:
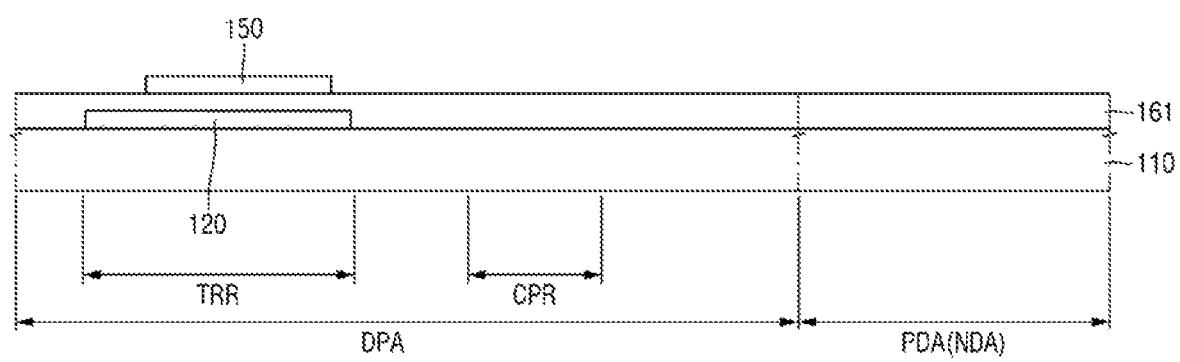

Referring to FIG. 7, the buffer layer 161 is formed on the entire surface of the first substrate 110 where the lower metal layer 120 is formed. As shown in the exemplary embodiment of FIG. 7, the buffer layer 161 may be formed on the entire surface of the display area DPA and the pad area PDA. The semiconductor layer 150 is formed on the buffer layer 161. In an exemplary embodiment, the semiconductor layer 150 may be formed by a mask process. For example, an oxide semiconductor may be deposited on the entire surface of the buffer layer 161 and may then be patterned by photolithography, thereby forming the semiconductor layer 150, as illustrated in FIG. 7.

Figure 8:
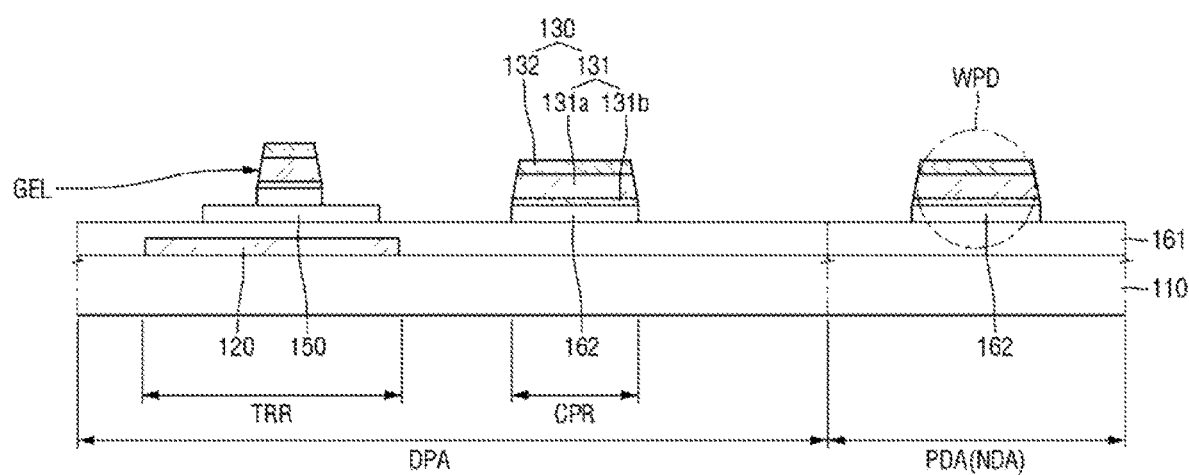

Referring to FIG. 8, the gate insulating film 162 and the gate conductive layer 130, which are patterned, are formed on the buffer layer 161 where the semiconductor layer 150 is formed. The gate insulating film 162 and the gate conductive layer 130 may be formed by a single mask process. For example, in an exemplary embodiment, a material layer for forming the gate insulating film 162 is deposited on the entire surface of the buffer layer 161 where the semiconductor layer 150 is formed. Material layers for forming the gate conductive metal layer 131 and the gate capping layer 132 are then sequentially deposited on the material layer for forming the gate insulating film 162. A photoresist layer is applied on the material layer for forming the gate capping layer 132 and is then subjected to exposure and development processes to form a photoresist pattern. The material layers for forming the gate capping layer 132, the gate conductive metal layer 131, and the gate insulating film 162 are sequentially etched using the photoresist pattern as an etching mask. The photoresist pattern is then removed, such as by a strip or asking process. In an alternative exemplary embodiment, instead of using the photoresist pattern alone as an etching mask to pattern the gate insulating film 162, patterned upper layers may be used as a hard mask for etching lower layers. In this embodiment, the photoresist pattern may be used as an etching mask together with the hard mask. In another exemplary embodiment, the photoresist pattern is removed after the formation of the hard mask, and the lower layers may be etched using the hard mask as an etching mask.

Figure 9:
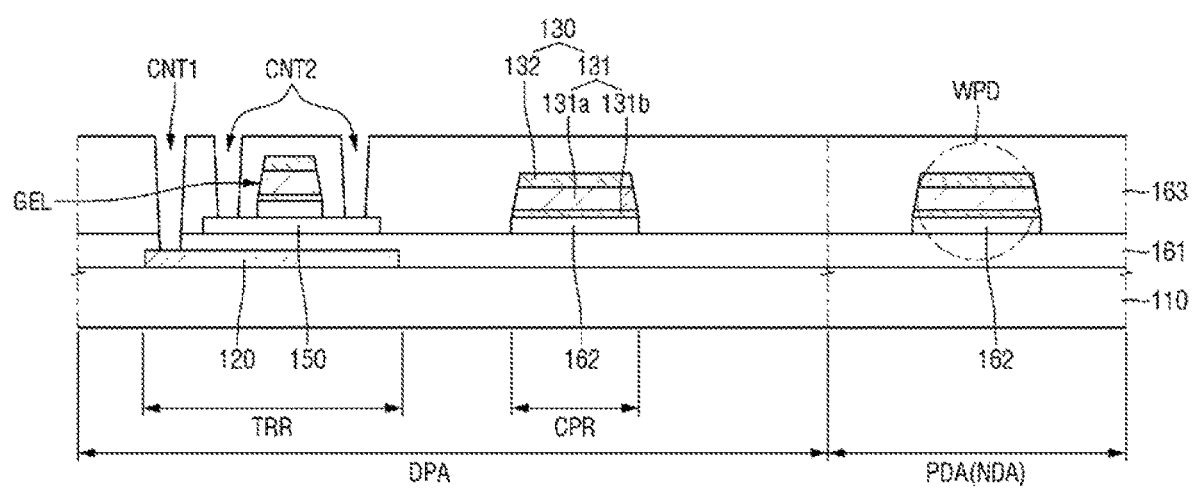

Referring to FIG. 9, the interlayer insulating film 163 is stacked on the buffer layer 161 where the gate conductive layer 130 is formed. The first contact hole CNT1, which exposes part of the lower metal layer 120, and the second contact holes CNT2, which expose portions of the semiconductor layer 150 (e.g., source and drain regions), are formed. In an exemplary embodiment, the first contact hole CNT1 and the second contact holes CNT2 may be formed by a mask process. The first contact hole CNT1 and the second contact holes CNT2 may be sequentially formed using different masks. For example, an insulating layer for forming the interlayer insulating film 163 is deposited on the entire surface of the buffer layer 161 where the gate conductive layer 130 is formed. A first photoresist pattern is formed on the insulating layer for forming the interlayer insulating film 163 to expose part of the lower metal layer 120, and the insulating layer for forming the interlayer insulating film 163 and the buffer layer 161 are etched using the first photoresist pattern as an etching mask to form the first contact hole CNT1, which exposes a portion of the lower metal layer 120. The first photoresist pattern is removed and a second photoresist pattern is formed on the insulating layer for forming the interlayer insulating film 163 to expose part of the semiconductor layer 150. The insulating layer for forming the interlayer insulating film 163 is etched using the first photoresist pattern as an etching mask, thereby forming the second contact holes CNT2.

The first contact hole CNT1 and the second contact holes CNT2 may be formed using the same mask. In this embodiment, the semiconductor layer 150 may be exposed to an etchant during the etching of the buffer layer 161 for forming the first contact hole CNT1. However, since the first contact hole CNT1 is formed first and then the second contact holes CNT2 are formed using a separate mask, damage to the surface of the semiconductor layer 150 can be suppressed or reduced.

Contact holes or openings may not be formed on the portion overlapping the gate conductive layer 130 in the pad area PDA, and the portion of the gate conductive layer 130 in the pad area PDA may be covered by the interlayer insulating film 163.

Figure 10:
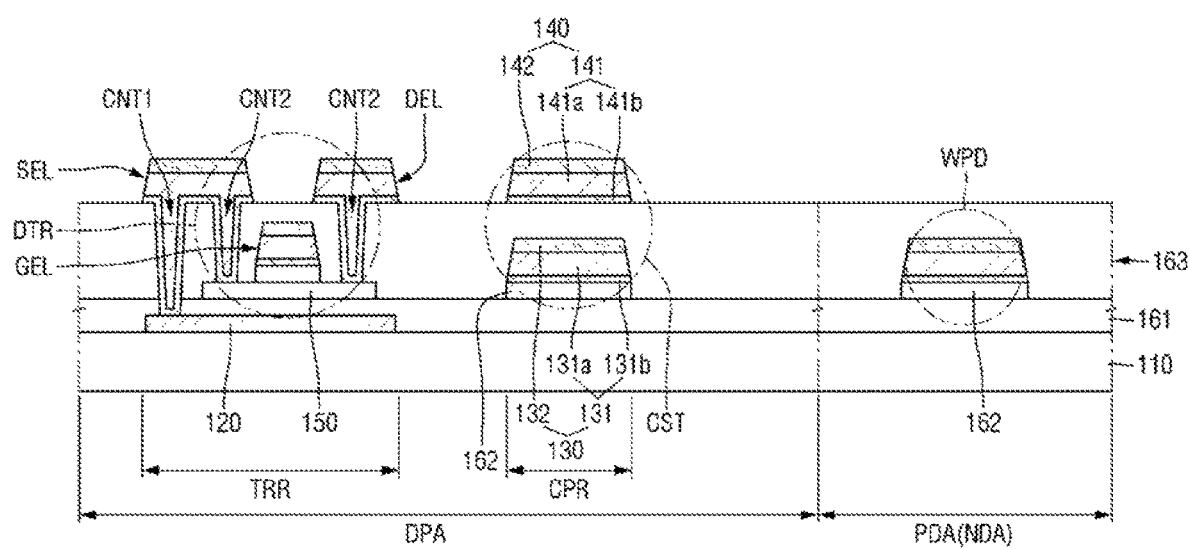

Referring to FIG. 10, the data conductive layer 140, which is patterned, is formed on the interlayer insulating film 163. In an exemplary embodiment, the data conductive layer 140 may be formed by a mask process. For example, material layers for forming the data conductive metal layer 141 and the data capping layer 142 are sequentially deposited on the entire surface of the interlayer insulating film 163. As shown in the exemplary embodiment of FIG. 10, the material layers for forming the data conductive metal layer 141 and the data capping layer 142 may be deposited even in the first contact hole CNT1 and in the second contact holes CNT2 so that the lower metal layer 120 and the semiconductor layer 150 may be connected. A photoresist layer is applied onto the material layer for forming the data capping layer 142 and is then subjected to exposure and development processes to form a photoresist pattern. The material layers for forming the data conductive metal layer 141 and the data capping layer 142 are etched using the photoresist pattern as an etching mask. The photoresist pattern is then removed, such as by a strip or ashing process, to form the data conductive layer 140, as illustrated in FIG. 10.

The patterning of the data conductive layer 140 may be performed and the interlayer insulating film 163 covers and protects the portion of the gate conductive layer 130 in the pad area PDA. Therefore, the portion of the gate conductive layer 130 in the pad area PDA is prevented from reacting with an etchant used in the patterning of the data conductive layer 140.

Figure 11:
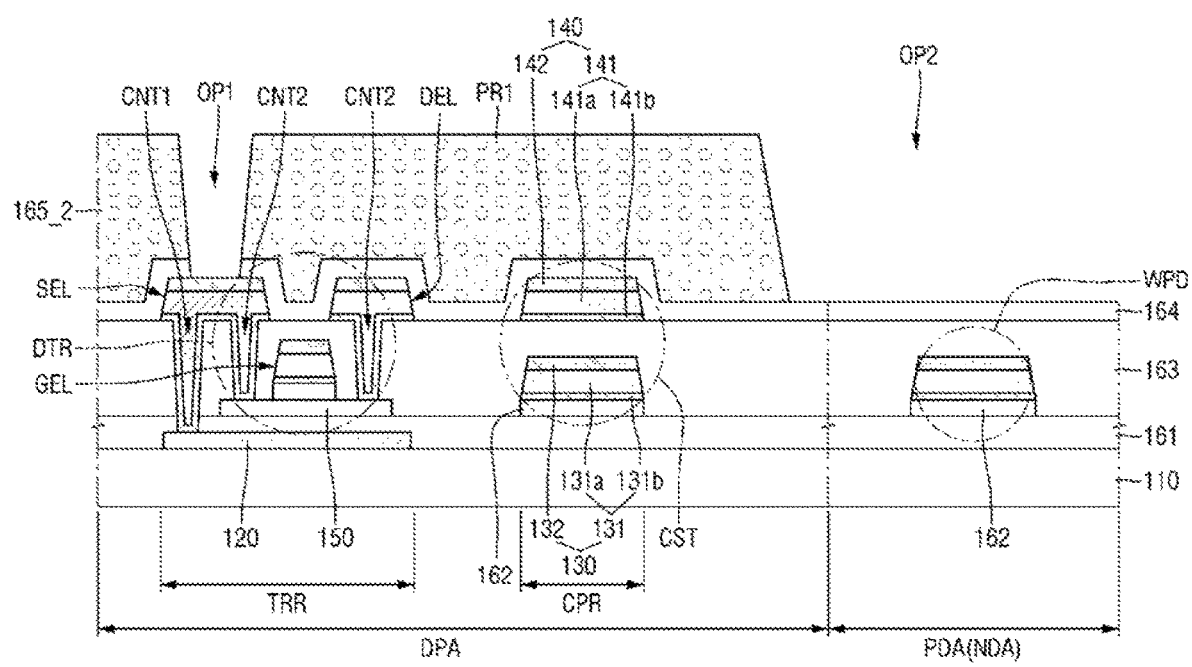

Referring to FIG. 11, the passivation layer 164 is formed on the interlayer insulating film 163 where the data conductive layer 140 is formed, and a photoresist pattern is formed on the passivation layer 164.

The passivation layer 164 is deposited on the entire surface of the interlayer insulating film 163 where the data conductive layer 140 is formed. In an exemplary embodiment, the passivation layer 164 may be deposited on the entire upper surface of the display area DPA and pad area PDA. Thereafter, a photoresist layer is formed on the passivation layer 164 and is then subjected to exposure and development processes to form a photoresist pattern PR1. The photoresist pattern PR1 includes a first opening OP1 which exposes a portion of the passivation layer 164 that overlaps with the source electrode SEL in the transistor region TRR and a second opening OP2 which exposes the pad area PDA. As shown in the exemplary embodiment of FIG. 11, the second opening OP2 may be formed in a portion of the display area DPA and may extend to the pad area PDA. For example, the width of the first opening OP1 (e.g., a length in the direction parallel to a top surface of the first substrate 110) may be smaller than, or the same as, the width of the source electrode SEL, and the width of the second opening OP2 may be greater than the width of the portion of the gate conductive layer 130 in the pad area PDA. However, exemplary embodiments of the present inventive concepts are not limited thereto.

Figure 12:
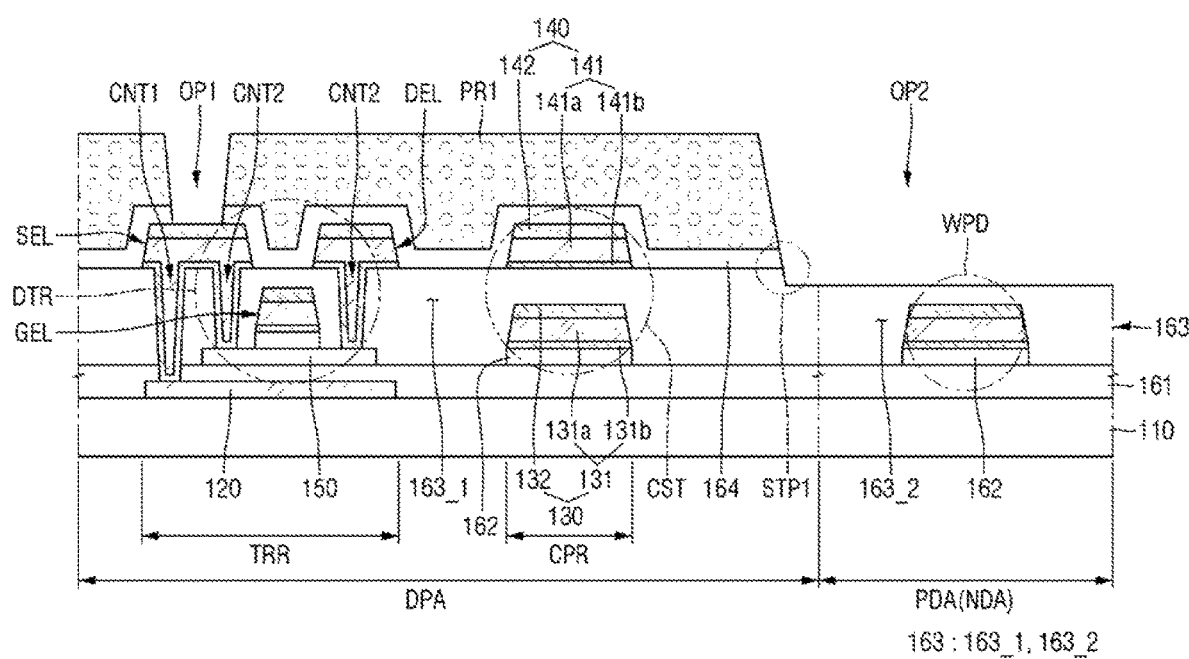

Referring to FIG. 12, the passivation layer 164 is etched using the photoresist pattern PR1 as an etching mask. Therefore, a portion of the passivation layer 164 exposed by the first opening OP1 is etched away so that a contact hole is formed to expose the source electrode SEL in the transistor region TRR. A portion of the passivation layer 164 exposed by the second opening OP2 is also removed so that the interlayer insulating film 164 is exposed on the portion of the gate conductive layer 130 in the pad area PDA. The passivation layer 164 is not disposed on at least the portion of the gate conductive layer 130 in the pad area PDA, and the portion of the gate conductive layer 130 in the pad area PDA does not overlap with the passivation layer 164 in the thickness direction.

In some exemplary embodiments, a portion of the interlayer insulating film 163 exposed by the second opening OP2 may be further etched so that the thickness of the interlayer insulating film 163 may be reduced in the pad area PDA (e.g., the first and second portions 163_1 and 163_2 may be formed). As a result of the etching process of FIG. 12, the interlayer insulating film 163 may become thinner on the portion of the gate conductive layer 130 in the pad area PDA than on a portion of the gate conductive layer 130 in the transistor region TRR or in the capacitor region CPR. However, the portion of the gate conductive layer 130 in the pad area PDA remains covered by the interlayer insulating film 163 and is not exposed by the etching process. The reduction of the thickness of the interlayer insulating film 163 in the pad area PDA permits a subsequent "entire-surface" etching process for exposing the portion of the gate conductive layer 130 in the pad area PDA to be effectively performed.

Figure 13:
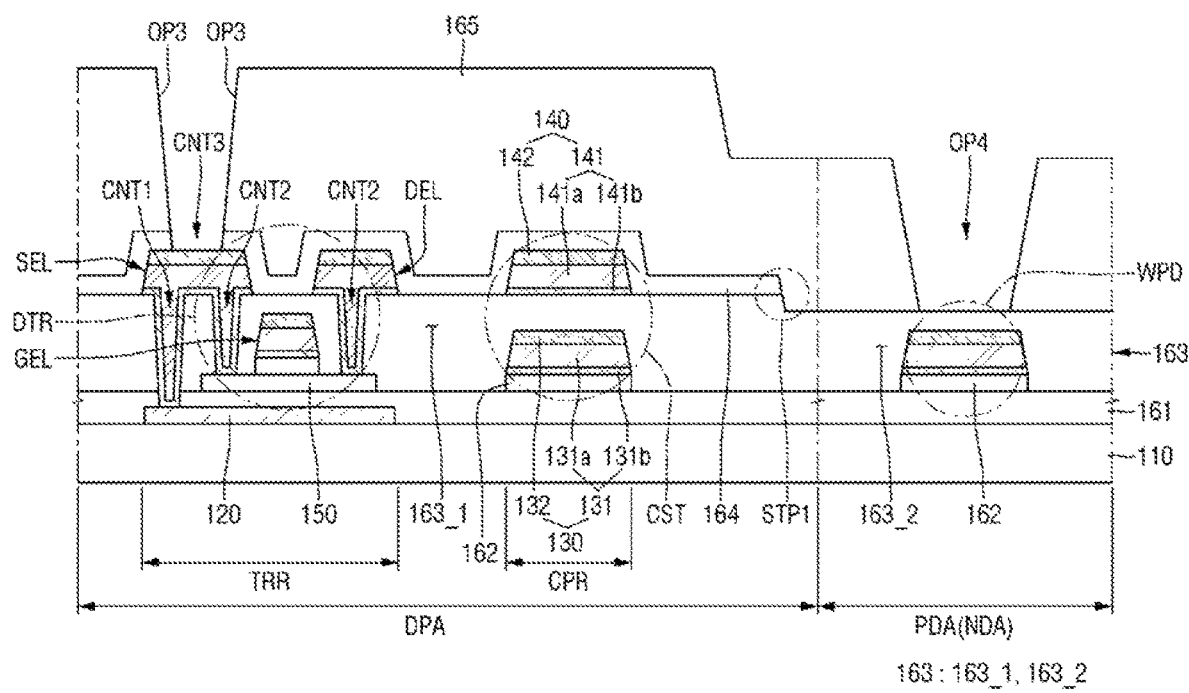

Referring to FIG. 13, the via layer 165, which is patterned, is formed on the passivation layer 164 and top portions of the display area DPA and the pad area PDA which had the passivation layer 164 removed. The via layer 165 may generally have a flat surface and may have different heights in different regions. For example, the height of the via layer 165 may be smaller in the pad area PDA than in the display area DPA.

The via layer 165 may include a third opening OP3 which exposes the contact hole of the passivation layer 164 that exposes the source electrode SEL and a fourth opening OP4 which exposes a portion of the interlayer insulating film 163 on the portion of the gate conductive layer 130 in the pad area PDA. The third opening OP3 may form the third contact hole CNT3 together with the contact hole of the passivation layer 164 that exposes the source electrode SEL. For example, as shown in the exemplary embodiment of FIG. 13, the width of the third opening OP3 (e.g., a length of the third opening in the direction parallel to a top surface of the first substrate 110) may be greater than the width of the contact hole of the passivation layer 164 that exposes the source electrode SEL, and the width of the fourth opening OP4 may be smaller than the width of a portion of the interlayer insulating film 163 in the pad area PDA that has a reduced thickness and may also be smaller than the width of the portion of the gate conductive layer 130 in the pad area PDA. However, exemplary embodiments of the present inventive concepts are not limited thereto.

In an exemplary embodiment, the via layer 165 may contain, for example, an organic material including a photosensitive material. In this embodiment, the via layer 165 may be formed by applying an organic material layer for forming the via layer 165 and subjecting the organic material layer to exposure and development processes to form the third and fourth openings OP3 and OP4. In an exemplary embodiment, the via layer 165, which has different heights in different regions, may be formed using a halftone mask or a slit mask.

When the via layer 165 is being applied, the via layer 165 may be in contact with the data conductive layer 140. However, since the data capping layer 142 is formed as the upper layer of the data conductive layer 140, the via layer 165 and the data conductive metal layer 141 are prevented from being in direct contact with each other. Accordingly, any corrosion defects that may be caused when the via layer 165 and the data conductive metal layer 141 are in direct contact with each other may be prevented.

Figure 14:
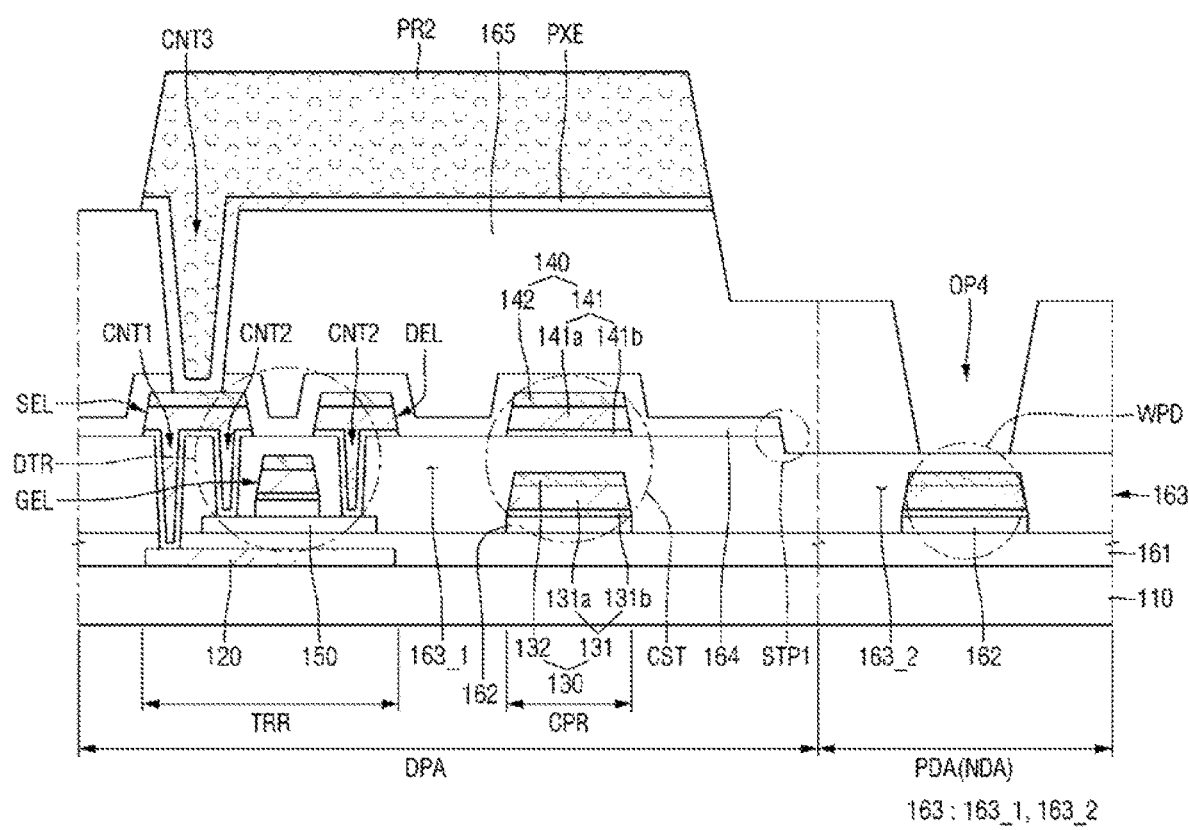

Referring to FIG. 14, the pixel electrode PXE, which is patterned, is formed on the via layer 165. In an exemplary embodiment, the pixel electrode PXE may be formed by a mask process. A material layer for forming the pixel electrode PXE is deposited on the entire surface of the via layer 165. The material for forming the pixel electrode PXE may be deposited even in the third contact hole CNT3 and may thus be connected to the source electrode SEL.

A photoresist layer is applied on the material layer for forming the pixel electrode PXE and is then subjected to exposure and development processes to form a photoresist pattern PR2 having a shape for forming the pixel electrode PXE. The material layer for forming the pixel electrode PXE is then etched using the photoresist pattern PR2 as an etching mask. In an exemplary embodiment, the material layer for forming the pixel electrode PXE may be etched by wet etching. However, exemplary embodiments of the present inventive concepts are not limited thereto. The portion of the gate conductive layer 130 in the pad area PDA is covered and protected by the portion of the interlayer insulating film 163 that has a reduced thickness. Thus, the portion of the gate conductive layer 130 in the pad area PDA is prevented from being in contact with, and damaged by, an etchant used in the etching of the pixel electrode PXE.

Figure 15:
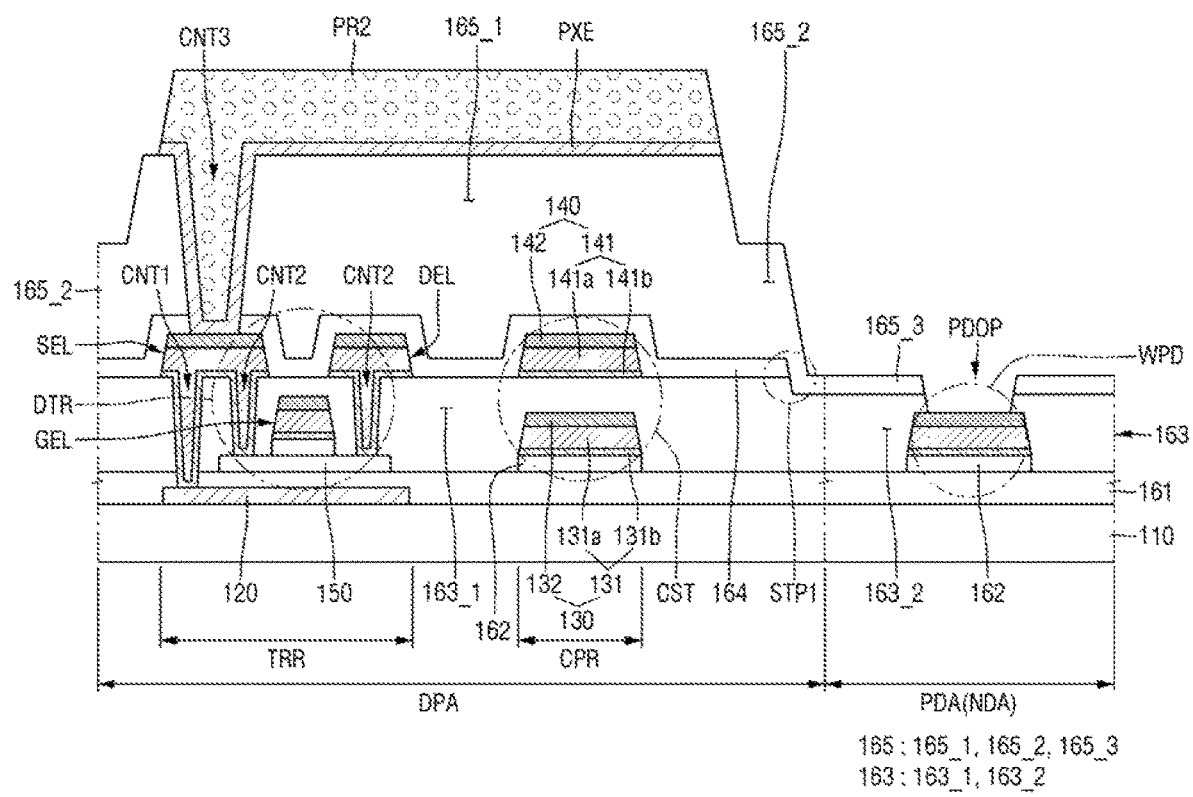

Referring to FIG. 15, an "entire-surface" etching process (e.g., an etching process directed on the entirety of the exposed upper surfaces) is performed with the photoresist pattern PR2 remaining on the pixel electrode PXE, thereby removing the interlayer insulating film 163 from above the portion of the gate conductive layer 130 in the pad area PDA to expose the gate conductive layer 130, such as the gate capping layer 132. As a result, the pad opening PDOP, which exposes part of the gate conductive layer 130, is formed. The via layer 165 and the passivation layer 164, which form the pad opening PDOP, may be aligned with each other in the pad opening PDOP. Therefore, the sidewalls of the pad opening PDOP may be substantially planar. The portion of the gate conductive layer 130 exposed by the pad opening PDOP may be used as the wire pad WPD. In the exemplary embodiments of FIGS. 6 through 15, the gate capping layer 132, which is formed together with the gate conductive metal layer 131 through a single mask process, may be used as the contact electrode of the wire pad WPD. Therefore, no additional mask process for forming the contact electrode of the wire pad WPD is needed, and as a result, the process efficiency can be improved.

During the "entire-surface" etching process, the pixel electrode PXE is covered and protected by the photoresist pattern PR2. However, the portions of the via layer 165, which are not covered by the photoresist pattern PR2, may be exposed and may be partially etched along with the interlayer insulating film 163. As a result, the height or thickness of the exposed portion of the via layer 165 may be reduced. Accordingly, the via layer 165 may have a stepped structure having different heights in different regions. For example, the first region 165_1 of the via layer 165, which is covered by the pixel electrode PXE in the display area DPA, may maintain a first height, and the second region 165_2 of the via layer 165, which is not covered by the pixel electrode PXE, may have a second height which is smaller than the first height. The height of the via layers 165 may also be reduced in the pad area PDA so that the third region 165_3 which has a third height may be formed. The photoresist pattern PR2 is then removed, such as by an ashing or strip process.

Referring to FIG. 5, the pixel-defining film PDL, which is patterned, is formed on the via layer 165 where the pixel electrode PXE is formed. In an exemplary embodiment, the pixel-defining film PDL may include an organic material including a photosensitive material. In this embodiment, the pixel-defining film PDL may be formed by applying an organic material layer for forming the pixel-defining film PDL and subjecting the organic material layer to exposure and development processes.

The pixel-defining film PDL may be formed along the boundaries of a pixel PX and may partially overlap with the pixel electrode PXE. The pixel-defining film PDL may be formed to overlap with the third contact hole CNT3. In an embodiment in which the pixel electrode PXE does not completely fill the third contact hole CNT3, but only partially fills the third contact hole CNT3, the pixel-defining film PDL may completely fill the third contact hole CNT3. The pixel-defining film PDL may also fill the second region 165_2 of the via layer 165 that has a relatively small height and may thus compensate for a height difference in the second region 165_2 of the via layer 165.

According to the exemplary embodiments of FIGS. 6 through 15, no additional mask process for forming the contact electrode of the wire pad WPD is needed. Therefore, the number of mask processes required is reduced, and the process efficiency of the manufacturing process is improved.

Other exemplary embodiments of the present inventive concepts will hereinafter be described, focusing mainly on the differences with the exemplary embodiments of FIGS. 1 through 15.

Figure 16:
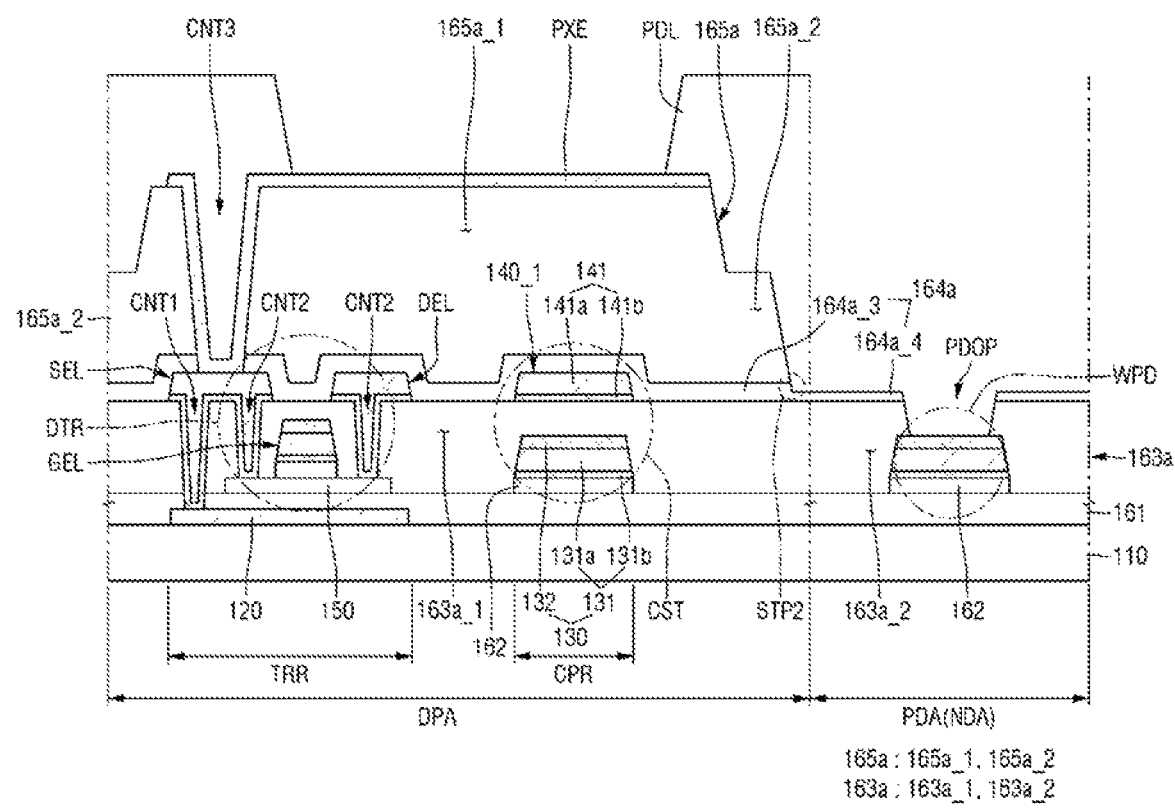
FIG. 16 is a cross-sectional view of a first display substrate of a display device according to another exemplary embodiment of the present inventive concepts.

A display device of FIG. 16 differs from the display device of FIG. 6 in the structure of a data conductive layer 140_1. The display device of FIG. 16 also differs from the display device of FIG. 6 in the structure of a stack of insulating layers in a pad area PDA.

Referring to FIG. 16, the data conductive layer 140_1 does not include a data capping layer 142. The data conductive layer 140_1 includes a data conductive metal layer 141 which includes a data base layer 141*b* and a data main metal layer 141*a*. As shown in the exemplary embodiment of FIG. 16, the data main metal layer 141*a* may be disposed directly on the data base layer 141*b*. However, the data conductive layer 140_1 does not include a data capping layer 142 that is disposed on the data conductive metal layer 141. The top surface of the data conductive layer 140_1 is formed of the data main metal layer 141*a*.

An interlayer insulating film 163*a* does not have a stepped structure. For example, the thickness of the interlayer insulating film 163*a* is substantially the same in both the pad area PDA and the display area DPA.

A passivation layer 164*a* is disposed on the display area DPA and in the pad area PDA. The passivation layer 164*a* has a stepped structure having different thicknesses in different regions. For example, in an exemplary embodiment, the passivation layer 164*a* may include a third portion 164*a*_3 in the display area DPA and a fourth portion 164*a*_4 in the pad area PDA. As shown in the exemplary embodiment of FIG. 16, the fourth portion 164*a*_4 may have a smaller thickness than the third portion 164*a*_3. The fourth portion 164*a*_4 of the passivation layer 164*a* may be located in the non-display area NDA, such as at least near a portion of the gate conductive layer 130 in the pad area PDA. A second stepped portion STP2 may be defined between the third and fourth portions 164*a*_3 and 164*a*_4.

In exemplary embodiments in which the passivation layer 164*a* is relatively thin near the portion of the gate conductive layer 130 in the pad area PDA, the contact electrode of a wire pad WPD can be easily exposed. Meanwhile, the passivation layer 164*a*, which is formed of an inorganic material, may have a surface shape reflecting any underlying stepped structure. In this embodiment, the thicknesses of portions of the passivation layer 164*a* as measured from the same flat reference surface (e.g., the top surface of the interlayer insulating film 163*a*) where there does not exist any underlying stepped structure may be compared.

A via layer 165*a* may not be disposed in the pad area PDA. Thus, the via layer 165*a* may include a first region 165*a*_1 which has a first height and a second region 165*a*_2 which has a second height that is smaller than the first height. As shown in the exemplary embodiment of FIG. 16, the second region 165*a*_2 may be on a portion of the display area DPA adjacent the pad area PDA and the first region 165*a*_1 may be on other portions of the display area DPA. However, the via layer 165*a* differs from the exemplary embodiment of FIG. 5 by not including a third region which has as third height. A side of the via layer 165 that faces the pad area PDA may be aligned with the second stepped portion STP2 of the passivation layer 164*a*.

FIGS. 17 through 21 are cross-sectional views illustrating processes of a method of fabricating the display device of FIG. 16.

Processes of forming a lower metal layer 120, which is patterned, a buffer layer 161, a semiconductor layer 150, a gate insulating film 162 and the gate conductive layer 130, which are patterned, and the interlayer insulating film 163*a* on a first substrate 110 and forming a first contact hole CNT1 and second contact holes CNT2 are the same as their respective counterparts of FIGS. 6 through 9.

Figure 17:
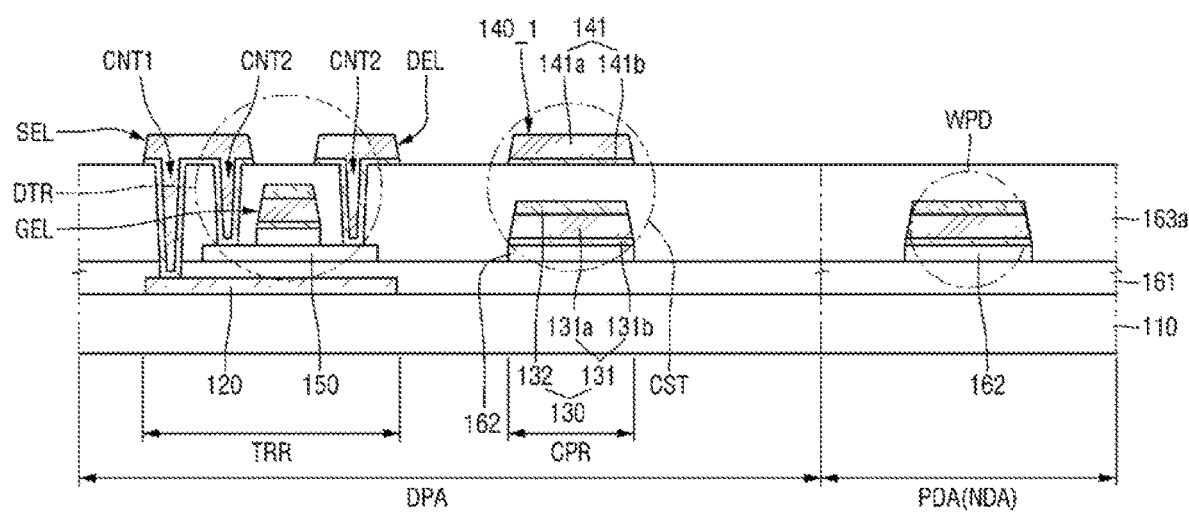
FIGS. 17 through 21 are cross-sectional views illustrating processes of a method of fabricating the display device of FIG. 16 according to exemplary embodiments of the present inventive concepts.

Referring to FIG. 17, the data conductive layer 140_1, which is patterned, is formed on the interlayer insulating film 163*a*. The data conductive layer 140_1 differs from the data conductive layer 140 of FIG. 10 by not including a data capping layer 142 (e.g., disposed above a data main metal layer 141*a*). The data main metal layer 141*a* forms the top surface of the data conductive layer 140. The data conductive layer 140_1 is formed in substantially the same manner as the data conductive layer 140 of FIG. 10, and thus, a detailed description thereof will be omitted.

Figure 18:
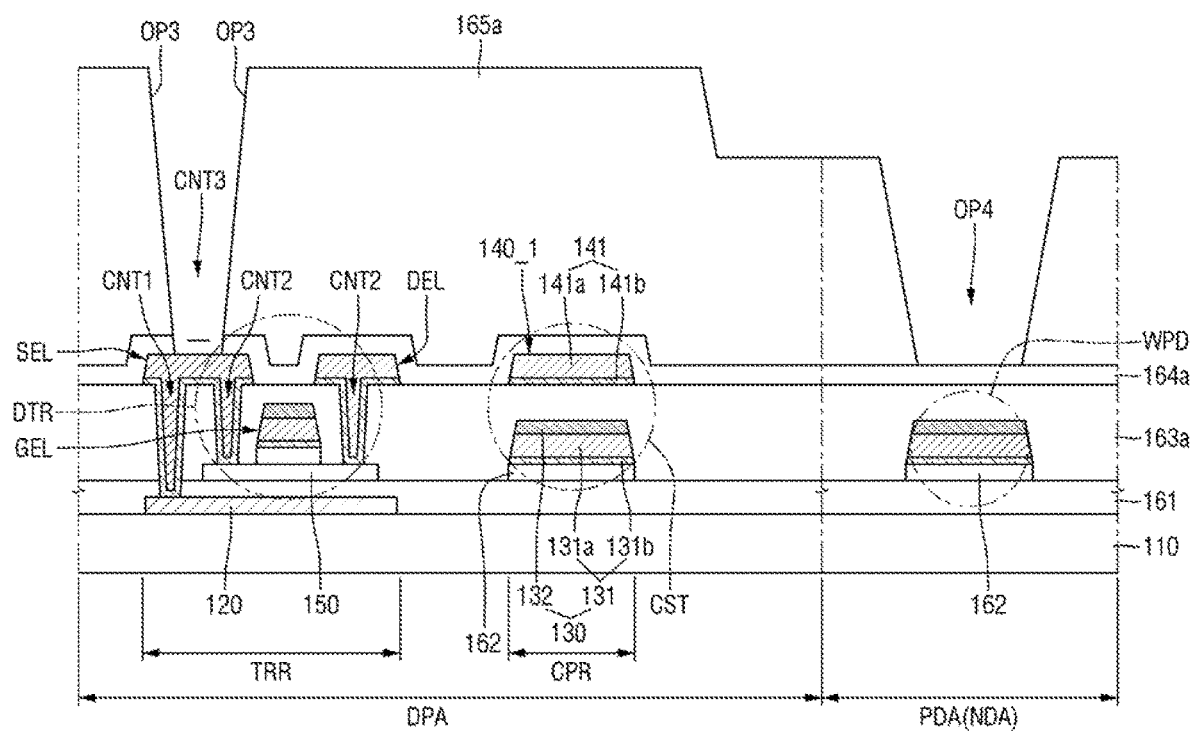

Referring to FIG. 18, the passivation layer 164*a* is formed on the interlayer insulating film 163*a* where the data conductive layer 140_1 is formed. As shown in the exemplary embodiment of FIG. 18, the passivation layer 164*a* may be formed on the entire display area DPA and pad area PDA. The via layer 165*a*, which is patterned, is formed on the passivation layer 164*a*. In the exemplary embodiments of FIGS. 16 through 21, unlike in the exemplary embodiments of FIGS. 6 through 15, the via layer 165*a* is formed directly on the passivation layer 164*a* without etching the passivation layer 164*a*. Therefore the passivation layer 165*a* may be disposed on the entire pad area PDA as well as the entire display area DPA.

In an exemplary embodiment the via layer 165*a* may generally have a flat surface and may have different heights in different regions. For example, the height of the via layer 165 may be smaller in the pad area PDA than in the display area DPA.

The via layer 165*a* may include a third opening OP3 which exposes a portion of the passivation layer 164*a* on a source electrode SEL and a fourth opening OP4 which exposes a portion of the passivation layer 164*a* on the portion of the gate conductive layer 130 in the pad area PDA.

In an exemplary embodiment, the via layer 165*a* may contain an organic material including a photosensitive material and may be formed by applying an organic material layer for forming the via layer 165*a* and subjecting the organic material layer to exposure and development processes to form openings. The via layer 165, which has different heights in different regions, may be formed using a halftone mask or a slit mask.

The data conductive layer 140_1 does not include a data capping film. However, since the data conductive layer 140_1 is covered by the passivation layer 164*a*, the via layer 165*a* and the data conductive layer 140_1 are not placed in direct contact with each other when applying the via layer 165*a*. Thus, any corrosion defects that may be caused when the via layer 165*a* and the data conductive metal layer 141 are in direct contact with each other may be prevented.

Figure 19:
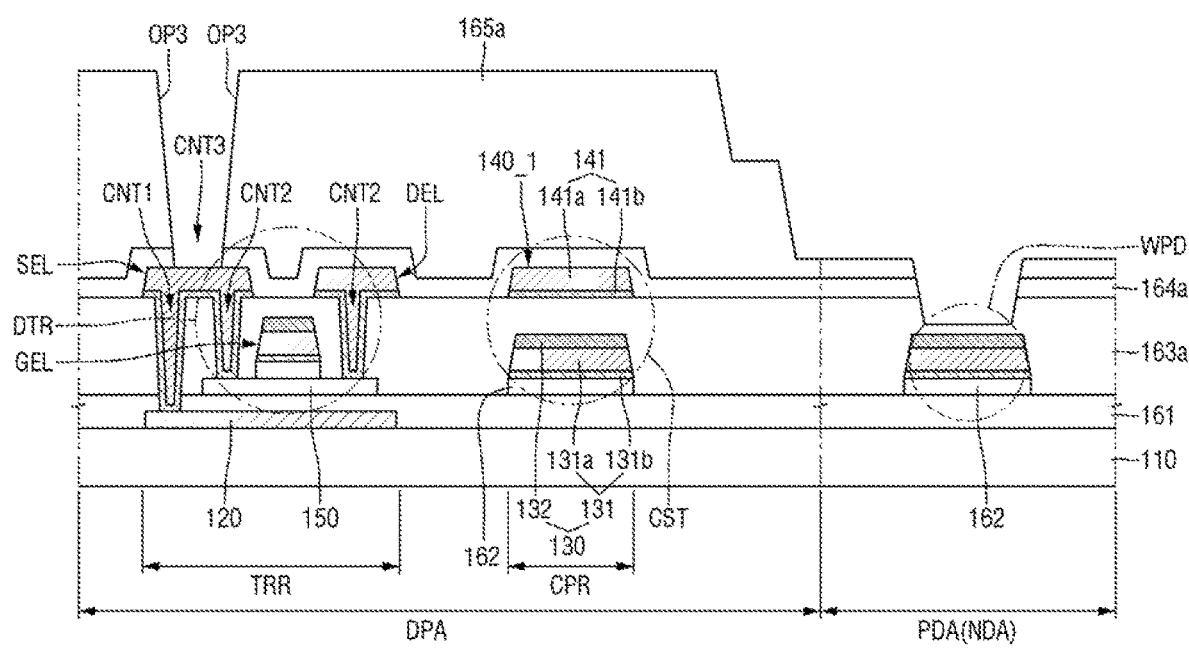

Thereafter, referring to FIG. 19, an "entire-surface" etching process is performed to remove a portion of the passivation layer 164*a* exposed by the third opening OP3 and remove a portion of the passivation layer 164*a* exposed by the fourth opening OP4. As a result, a third contact hole CNT3 which exposes the surface of the source electrode SEL is formed, and a portion of the interlayer insulating film 163 on the portion of the first gate conductive layer 130 in the pad area PDA is exposed. In an exemplary embodiment, the "entire-surface" etching process may be a dry etching process. A portion of the via layer 165a exposed by the "entire-surface" etching process may also be etched along with the passivation layer 164a so that the height or thickness of the via layer 165a may be reduced. A partial etching process may be further performed on the part of the interlayer insulating film 163a exposed by the fourth opening OP4 so that the thickness of the interlayer insulating film 164a may be further reduced in the pad area PDA. For example, as a result of the "entire-surface" and partial etching processes of FIG. 19, the interlayer insulating film 163a may become thinner on the portion of the gate conductive layer 130 in the pad area PDA than on a portion of the gate conductive layer 130 in the display area DPA. However, the portion of the gate conductive layer 130 in the pad area PDA is still covered by the interlayer insulating film 163a and is not exposed. By reducing the thickness of the interlayer insulating film 163a in the pad area PDA, a subsequent "entire-surface" etching process for exposing the portion of the gate conductive layer 130 in the pad area PDA can be further effectively performed.

Figure 20:
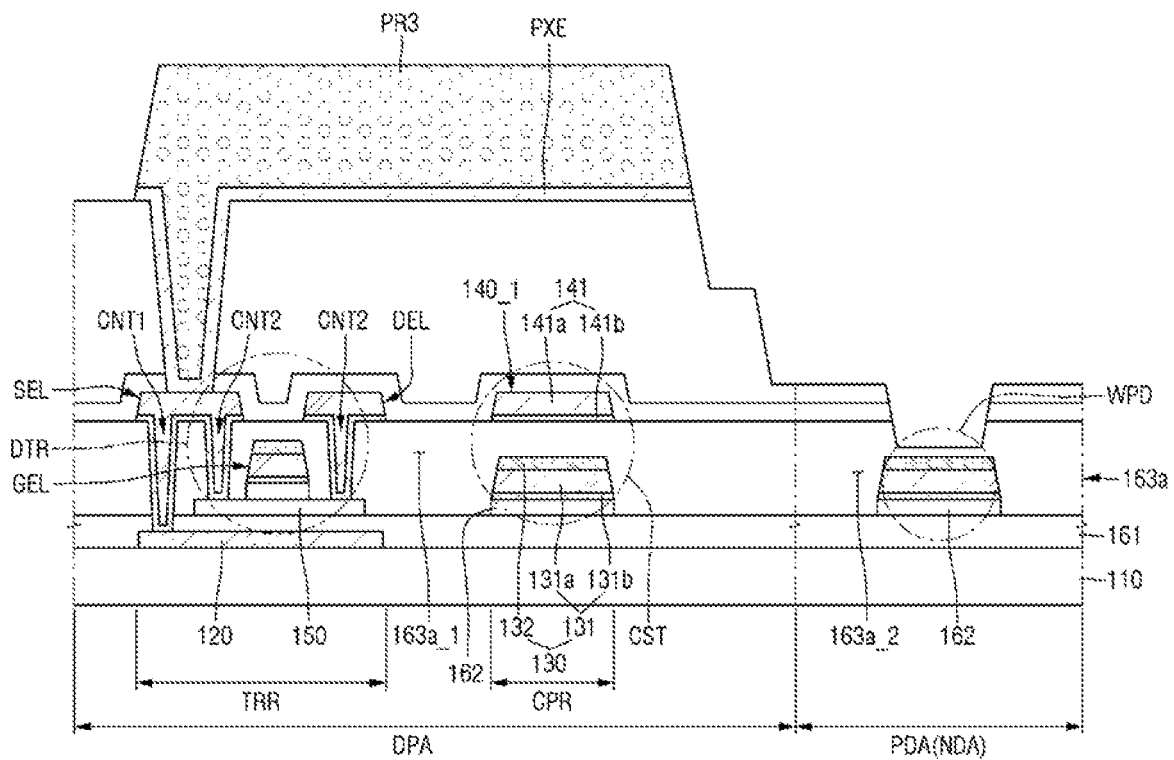

Referring to FIG. 20, a pixel electrode PXE, which is patterned, is formed on the via layer 165a. The pixel electrode PXE may be formed by a mask process. For example, a material layer for forming the pixel electrode PXE is deposited on the entire surface of the via layer 165a. The material for forming the pixel electrode PXE may be deposited even in the third contact hole CNT3 and may thus be connected to the source electrode SEL.

A photoresist layer is applied on the material layer for forming the pixel electrode PXE and is then subjected to exposure and development processes to form a photoresist pattern PR3 having a shape for forming the pixel electrode PXE. Thereafter, the material layer for forming the pixel electrode PXE is etched using the photoresist pattern PR3 as an etching mask. The material layer for forming the pixel electrode PXE may be etched by wet etching. However, exemplary embodiments of the present inventive concepts are not limited thereto. The portion of the gate conductive layer 130 in the pad area PDA is covered and protected by the portion of the interlayer insulating film 163a that has a reduced thickness. Thus, the portion of the gate conductive layer 130 in the pad area PDA is prevented from being in contact with, and damaged by, an etchant used in the etching of the pixel electrode PXE.

Figure 21:
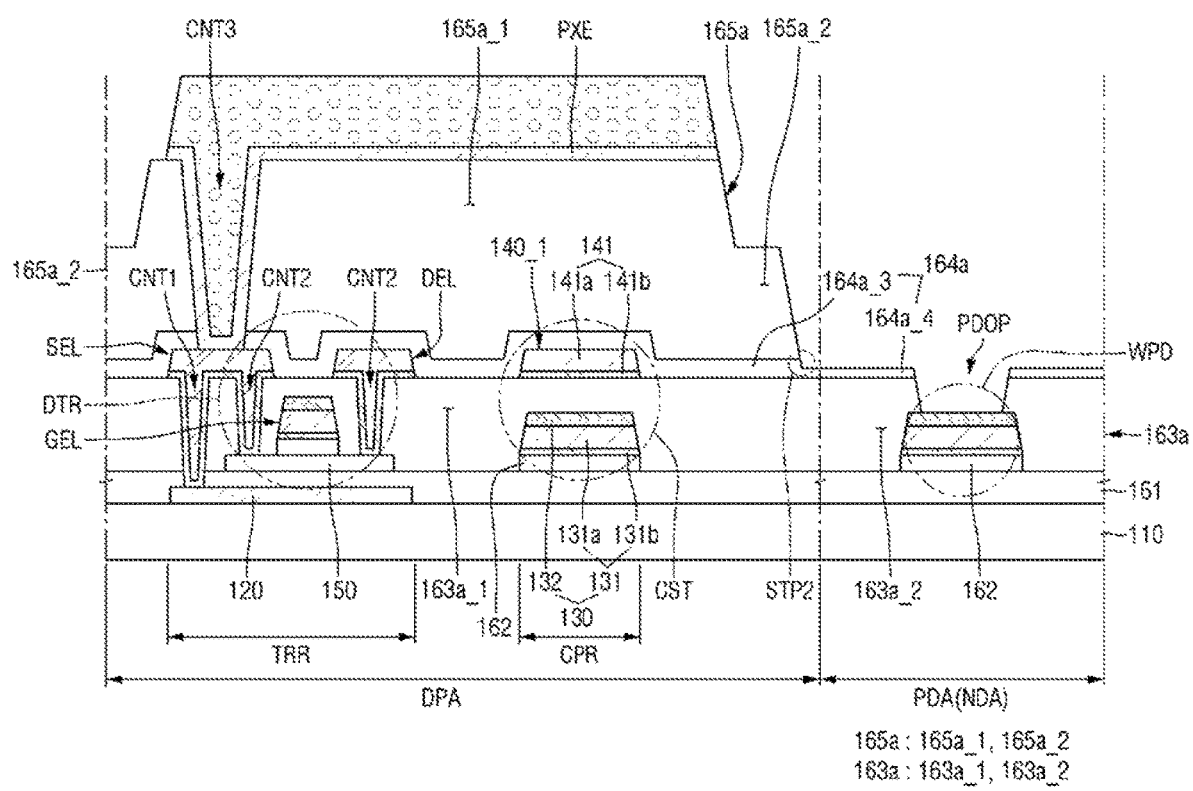

Referring to FIG. 21, an "entire-surface" etching process is performed with the photoresist pattern PR3 remaining on the pixel electrode PXE, thereby removing the interlayer insulating film 163 from above the portion of the gate conductive layer 130 in the pad area PDA to expose the gate conductive layer 130, such as the gate capping layer 132.

The exposed portion of the gate conductive layer 130 in the pad area PDA may be used as the wire pad WPD. In the exemplary embodiment of FIGS. 17 through 21, the gate capping layer 132, which is formed together with the gate conductive metal layer 131 through a single mask process, may be used as the contact electrode of the wire pad WPD. Thus, no additional mask process for forming the contact electrode of the wire pad WPD is needed, and as a result, the process efficiency is improved.

Meanwhile, during the "entire-surface" etching process the pixel electrode PXE is covered and protected by the photoresist pattern PR3. However, the via layer 165a, which is not covered by the photoresist pattern PR3, may be exposed and may be partially etched along with the interlayer insulating film 163a. As a result, the height or thickness of the exposed portion of the via layer 165a may be reduced. Accordingly, the via layer 165a may have a stepped structure having different heights in different regions. The first region 165a_1 of the via layer 165a, which is covered by the pixel electrode PXE in the display area DPA, may have a first height, and the second region 165a_2 of the via layer 165a, which is not covered by the pixel electrode PXE, may have a second height which is smaller than the first height. The via layer 165a, which has a relatively small thickness in the pad area PDA, may be completely removed from the pad area PDA by the "entire-surface" etching process. Once the via layer 165a is removed from the pad area PDA, the passivation layer 164a is exposed. Due to the "entire-surface" etching process of FIG. 21, the thickness of the passivation layer 164a is also reduced so that the passivation layer 164a may be divided into the third and fourth portions 164a_3 and 164a_4. As shown in the exemplary embodiment of FIG. 21, the third portion 164a_3 of the passivation layer may be disposed in the display area DPA and the fourth portion 164a_4 of the passivation layer may be disposed on an edge of the display area and on portions of the pad area PDA. The second stepped portion STP2 may be defined between the third and fourth portions 164a_3 and 164a_4. The photoresist pattern PR3 is removed, such as by an ashing or strip process.

Referring to FIG. 16, the pixel-defining film PDL, which is patterned, is formed on the via layer 165a where the pixel electrode PXE is formed. The pixel-defining film PDL may contain, for example, an organic material including a photosensitive material. In this embodiment, the pixel-defining film PDL may be formed by applying an organic material layer for forming the pixel-defining film PDL and subjecting the organic material layer to exposure and development processes.

The pixel-defining film PDL may be formed along the boundaries of a pixel PX and may partially overlap with the pixel electrode PXE. The pixel-defining film PDL may be formed to overlap with the third contact CNT3. In an embodiment in which the pixel electrode PXE does not completely fill the contact hole CNT3, but only partially fills the third contact hole CNT3, the pixel-defining film PDL may completely fill the third contact hole CNT3. The pixel-defining film PDL may also fill the second region 165a_2 of the via layer 165a that has a relatively small height and may thus compensate for a height difference in the second region 165a_2 of the via layer 165a.

According to the exemplary embodiments of FIGS. 17 through 21, no additional mask process for forming the contact electrode of the wire pad WPD is needed. Additionally, in exemplary embodiments in which there is no data capping film provided in the data conductive layer 140_1, the data conductive metal layer 141 of the data conductive layer 140_1 is prevented from being in direct contact with the via layer 165a, and thus, corrosion defects are prevented. Also, since the passivation layer 164a can be etched using the opening OP3 of the via layer 165a without the need to use an additional mask, the number of mask processes required is reduced, and as a result, the process efficiency is further improved.

In concluding the detailed description, those skilled in the art will appreciate that many variations and modifications can be made to the exemplary embodiments without substantially departing from the principles of the present inventive concepts. Therefore, the disclosed exemplary embodiments of the present inventive concepts are used in a generic and descriptive sense only and not for purposes of limitation.

What is claimed is:

1. A display device comprising:
    a substrate including a display area and a pad area;
    a gate conductive layer disposed on the substrate, the gate conductive layer comprising:
        a gate conductive metal layer and a gate capping layer that is disposed on the gate conductive metal layer; and
        the gate conductive layer forms a gate electrode disposed in the display area and a wire pad disposed in the pad area;
    an interlayer insulating film disposed on the gate conductive layer and covering the gate electrode, wherein the wire pad is exposed by a pad opening;
    a data conductive layer disposed on the interlayer insulating film in the display area, the data conductive layer including source and drain electrodes;
    a passivation layer disposed on the data conductive layer and covering the source and drain electrodes;
    a via layer disposed on the passivation layer; and
    a pixel electrode disposed on the via layer, the pixel electrode is connected to the source electrode through a contact hole that penetrates the via layer and the passivation layer,
    wherein
    the via layer includes a first region overlapping with the pixel electrode in the display area and a second region not overlapping with the pixel electrode in the display area and having a smaller height than a height of the first region.

2. The display device of claim 1, wherein:
    the pad opening is formed by the interlayer insulating film and the via layer; and
    the interlayer insulating film and the via layer form aligned inner sidewalls of the pad opening.

3. The display device of claim 2, wherein the passivation layer is not disposed in the pad area.

4. The display device of claim 3, wherein the via layer is disposed directly on the interlayer insulating film in the pad area.

5. The display device of claim 2, wherein:
    the via layer further includes a third region which is disposed in the pad area; and
    the third region has a smaller height than a height of the second region.

6. The display device of claim 5, wherein:
    the interlayer insulating film includes a first portion disposed in the display area and a second portion disposed in the pad area and having a smaller thickness than a thickness of the first portion; and
    the second portion overlaps with the third region of the via layer.

7. The display device of claim 1, wherein:
    the pad opening is formed by the interlayer insulating film and the passivation layer; and
    the interlayer insulating film and the passivation layer form aligned inner sidewalls of the pad opening.

8. The display device of claim 7, wherein the via layer is not disposed in the pad area.

9. The display device of claim 7, wherein the passivation layer includes a third portion that is disposed in the display area and a fourth portion which is disposed in the pad area and has a smaller thickness than a thickness of the third portion.

10. The display device of claim 1, wherein:
    a pixel-defining film is disposed on the pixel electrode and the pixel-defining film fills the second region of the via layer.

11. The display device of claim 1, wherein the gate capping layer includes at least one selected from a zinc indium oxide (ZIO) film, an indium zinc oxide (IZO) film, an indium tin oxide (ITO) film, and a titanium (Ti)/molybdenum (Mo)/indium tin oxide (ITO) film.

12. The display device of claim 11, wherein the gate conductive metal layer includes a gate main metal layer that contacts the gate capping layer from below the gate capping layer, the gate main metal layer including copper (Cu).

13. A method of fabricating a display device, comprising:
    forming a substrate including a display area and a pad area;
    forming a gate conductive layer on the substrate, the gate conductive layer including a gate conductive metal layer and a gate capping layer deposited on the gate conductive metal layer, the gate conductive layer forming a gate electrode disposed in the display area, and a wire pad disposed in the pad area;
    forming an interlayer insulating film on the gate conductive layer;
    forming a data conductive layer on the interlayer insulating film, the data conductive layer including source and drain electrodes that are disposed in the display area;
    forming a passivation layer on the data conductive layer;
    forming a via layer on the passivation layer, the via layer including a first opening that overlaps with the source electrode in the display area and a second opening that overlaps with the wire pad in the pad area;
    forming a first material layer for forming a pixel electrode on the via layer, forming a first mask pattern on the first material layer, and etching the first material layer using the first mask pattern; and
    exposing the wire pad by etching the interlayer insulating film, which overlaps with the wire pad, with a remaining portion of the first mask pattern.

14. The method of claim 13, wherein the etching the interlayer insulating film with the remaining portion of the first mask pattern is performed by an entire-surface etching process.

15. The method of claim 14, wherein a portion of the via layer not covered by the first mask pattern is etched by the entire-surface etching process and the via layer is divided into a first region overlapping with the pixel electrode and a second region not overlapping with the pixel electrode and having a smaller height than a height of the first region.

16. The method of claim 13, wherein the forming of the passivation layer comprises:
    forming a second material layer on the data conductive layer;
    forming a second mask pattern on the second material layer to expose the pad area and a portion of the second material layer that overlaps with the source electrode; and
    etching the passivation layer using the second mask pattern.

17. The method of claim 16, wherein during the etching of the passivation layer, a portion of the interlayer insulating film in the pad area is etched to divide the interlayer insulating film into a first portion disposed in the display area and a second portion disposed in the pad area and having a smaller thickness than a thickness of the first portion.

18. The method of claim 13, further comprising:

forming the via layer on a portion of the passivation layer that is not etched by performing an entire-surface etching to remove a portion of the passivation layer exposed by the second opening of the via layer.

19. The method of claim 13, wherein the gate capping layer includes at least one selected from zinc indium oxide (ZIO) film, an indium zinc oxide (IZO) film, an indium tin oxide (ITO) film, and a titanium (Ti)/molybdenum (Mo)/indium tin oxide (ITO) film.

20. The method of claim 19, wherein the gate conductive metal layer includes a gate main metal layer that is in contact with the gate capping layer from below the gate capping layer and includes copper (Cu).

21. A display device comprising:
   a substrate including a display area and a pad area;
   a gate conductive layer disposed on the substrate, the gate conductive layer comprising:
      a gate conductive metal layer and a gate capping layer that is disposed above the gate conductive metal layer; and
      the gate conductive layer forms a gate electrode disposed in the display area and a wire pad disposed in the pad area;
   an interlayer insulating film disposed on the gate conductive layer and covering the gate electrode; and
   the gate capping layer of the wire pad is exposed by a pad opening and the gate capping layer is configured to be a contact electrode for the wire pad.

* * * * *